United States Patent
Bag et al.

(10) Patent No.: US 10,431,393 B2
(45) Date of Patent: Oct. 1, 2019

(54) DEFECT MITIGATION OF THIN-FILM HYBRID PEROVSKITE AND DIRECT WRITING ON A CURVED SURFACE

(71) Applicant: Government of the United States, as represented by the Secretary of the Air Force, Wright-Patterson AFB, OH (US)

(72) Inventors: Santanu Bag, West Chester, OH (US); James R. Deneault, Dayton, OH (US); Michael F. Durstock, West Chester, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 3 days.

(21) Appl. No.: 15/889,806

(22) Filed: Feb. 6, 2018

(65) Prior Publication Data
US 2018/0261394 A1    Sep. 13, 2018

Related U.S. Application Data

(60) Provisional application No. 62/468,734, filed on Mar. 8, 2017.

(51) Int. Cl.
| | |
|---|---|
| *H01G 9/20* | (2006.01) |
| *H01L 51/00* | (2006.01) |
| *H01L 51/42* | (2006.01) |

(52) U.S. Cl.
CPC .......... *H01G 9/20* (2013.01); *H01L 51/0013* (2013.01); *H01L 51/0028* (2013.01);
(Continued)

(58) Field of Classification Search
CPC ... H01G 9/20; H01L 51/0028; H01L 51/4293; H01L 51/0013; H01L 51/0096;
(Continued)

(56) References Cited

U.S. PATENT DOCUMENTS

| | | |
|---|---|---|
| 5,871,579 A | 2/1999 | Liang |
| 6,180,956 B1 | 1/2001 | Chondroudis |

(Continued)

FOREIGN PATENT DOCUMENTS

| | | |
|---|---|---|
| WO | WO2013171520 | 11/2013 |
| WO | WO2014180780 | 11/2014 |

(Continued)

OTHER PUBLICATIONS

Chunhe Yang; Erjun Zhou; Shoji Miyanishi; Kazuhito Hashimoto; and Keisuke Tajima; "Preparation of Active Layers in Polymer Solar Cells by Aerosol Jet Printing"; 2011; ACS Publications; ACS Applied Materials & Interfaces; (Year: 2011).*

(Continued)

*Primary Examiner* — William F Kraig
*Assistant Examiner* — Vicki B. Booker
(74) *Attorney, Agent, or Firm* — AFMCLO/JAZ; Timothy M. Barlow

(57) ABSTRACT

A method for aerosol-jet printing a layered perovskite structure by applying a PEDOT:PSS layer to a substrate; applying a layer of lead iodide ($PbI_2$) to the PEDOT:PSS layer; and applying an aerosol mist of methylammonium iodide ($CH_3NH_3I$) atop the $PbI_2$ layer with an aerosol-jet nozzle to form a $CH_3NH_3PbI_3$ perovskite film layer. The substrate may be an ITO glass substrate, and the PEDOT:PSS layer may be applied by a process selected from spin-coating, inkjet-printing, slot-die-coating, aerosol-jet printing, physical vapor deposition, chemical vapor deposition, and electrochemical deposition. The $PbI_2$ layer may be applied by a
(Continued)

process selected from spin-coating, aerosol-jet printing, inkjet-printing, slot-die-coating, physical vapor deposition, chemical vapor deposition, and electrochemical deposition, and the $PbI_2$ for application to the PEDOT:PSS layer may be in a solution of DMF, DMSO, γ-butyrolactone, or a combination thereof.

19 Claims, 17 Drawing Sheets
(11 of 17 Drawing Sheet(s) Filed in Color)

(52) U.S. Cl.
CPC ........ H01L 51/0096 (2013.01); H01L 51/424 (2013.01); H01L 51/4293 (2013.01); *H01L 51/0007* (2013.01); *H01L 51/0037* (2013.01); *H01L 2251/308* (2013.01); *Y02E 10/549* (2013.01)

(58) Field of Classification Search
CPC ............. H01L 51/424; H01L 2251/308; H01L 51/0037; Y02E 10/549
See application file for complete search history.

(56) References Cited

U.S. PATENT DOCUMENTS

| | | | | |
|---|---|---|---|---|
| 2014/0332078 | A1* | 11/2014 | Guo | H01L 51/424 136/261 |
| 2015/0367616 | A1 | 12/2015 | Christoforo | |
| 2017/0287648 | A1* | 10/2017 | Wu | H01G 9/2009 |

FOREIGN PATENT DOCUMENTS

| | | |
|---|---|---|
| WO | WO2014202965 | 12/2014 |
| WO | WO2015127494 | 9/2015 |
| WO | WO2015177521 | 11/2015 |

OTHER PUBLICATIONS

DAS, High-Performance Flexible Perovskite Solar Cells by Using a Combination of Ultrasonic Spray-Coating and Low Thermal Budget Photonic Curing, ACSPhotonics, 2015, 2, 680-686.

Hwang, Toward Large Scale Roll-to-Roll Production of Fully Printed Perovskite Solar Cells, Advanced Materials, 2015, 27, 1241-1247.

Barrows, Efficient planar heterojunction mixed-halide perovskite solar cells deposited via spraydeposition, Energy and Env. Sci., 2014, 7, 2944-2950.

Po, From lab to fab: how must the polymer solar cell materials design change?—an industrial perspective, Energy and Env. Sci., 2014, 7, 925-943.

Hao, Controllable Perovskite Crystallization at Gas—Solid Interface for Hole Conductor-Free Solar Cells with Steady Power Conversion Efficiency, JACS, 2014, 136, 16411-16419.

Zhang, Metal halide perovskites for energy applications, Nature Energy, 2016, 1, 16048.

Kaltenbrunner, Flexible high power-per-weight perovskite solar cells with chromium oxide—metal contacts for improved stability in air, Nature Mater., 2015, 14, 1032-1039.

* cited by examiner

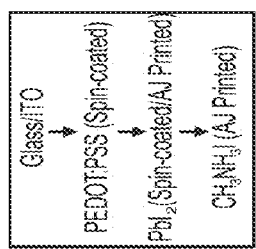
FIG. 1B
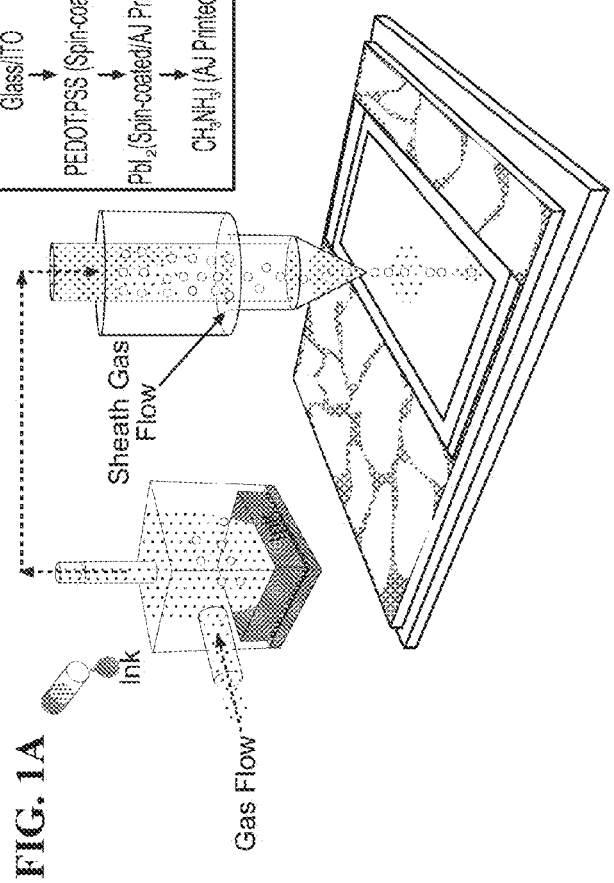
FIG. 1A
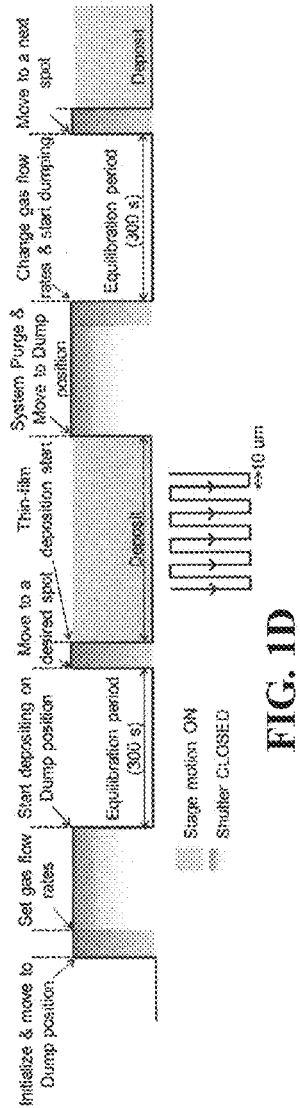
FIG. 1C
FIG. 1D

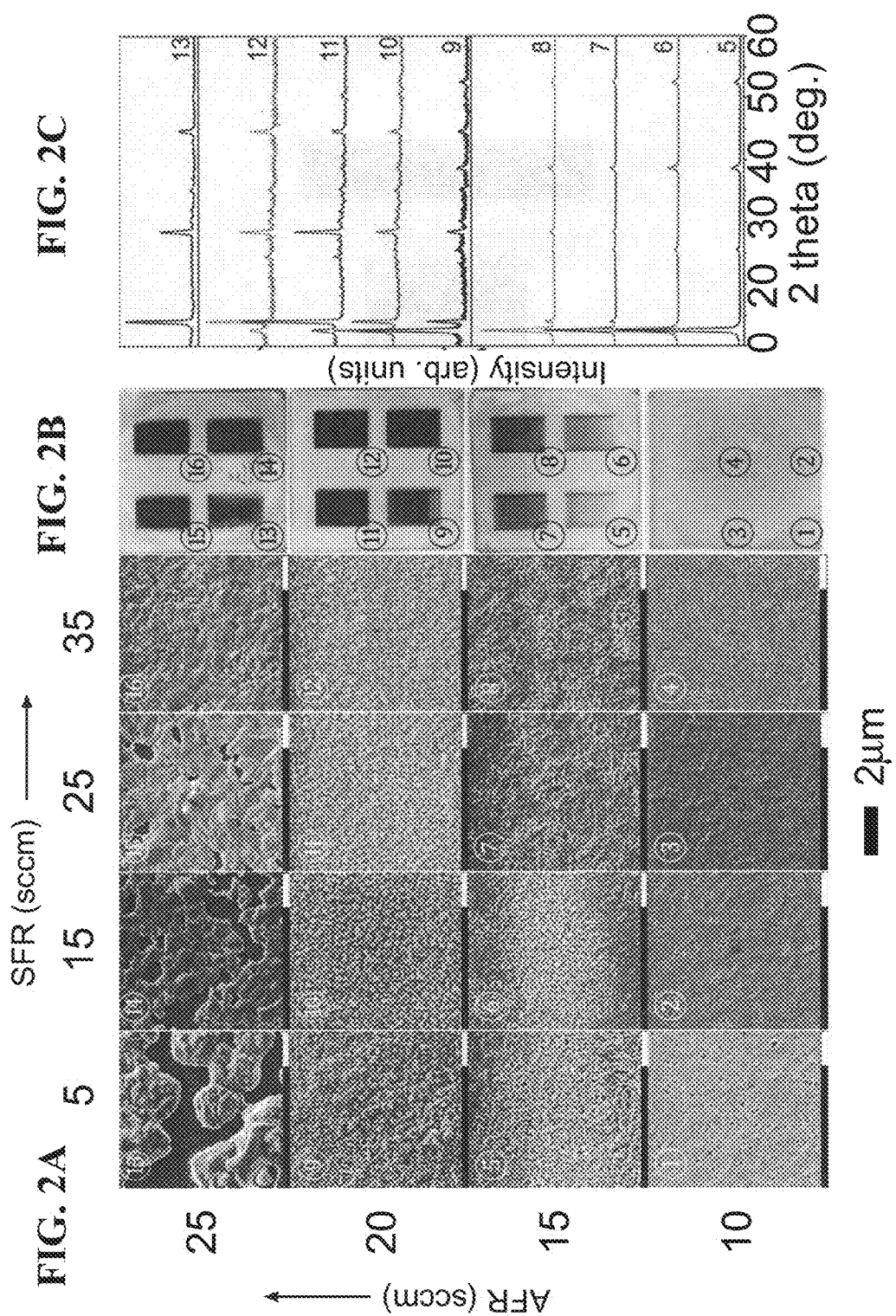

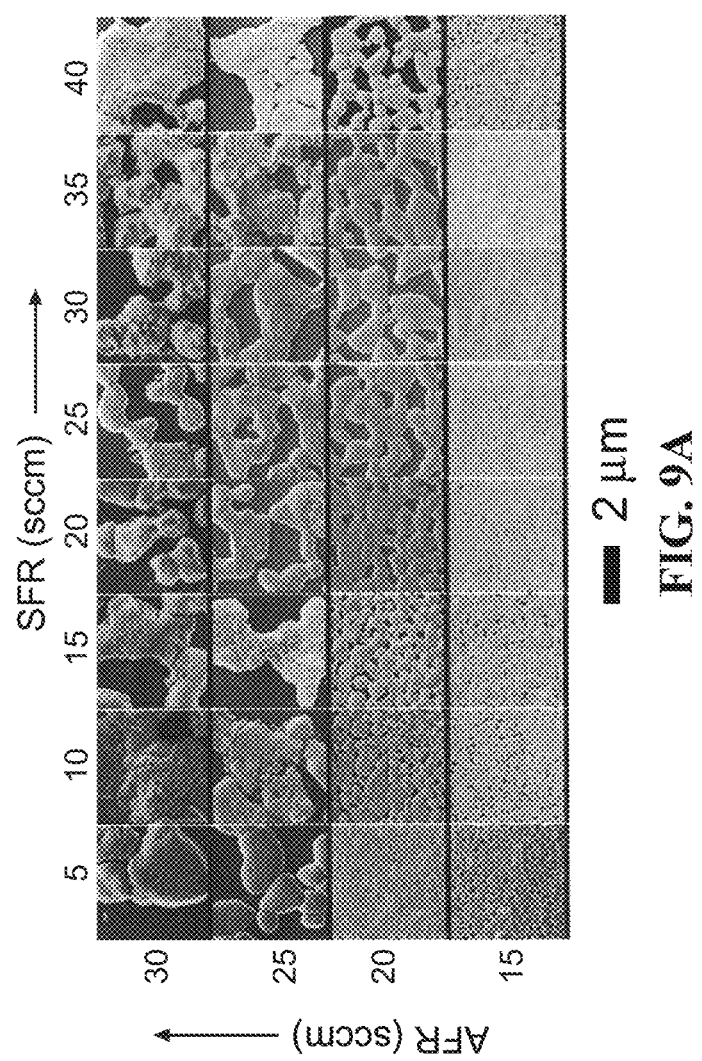

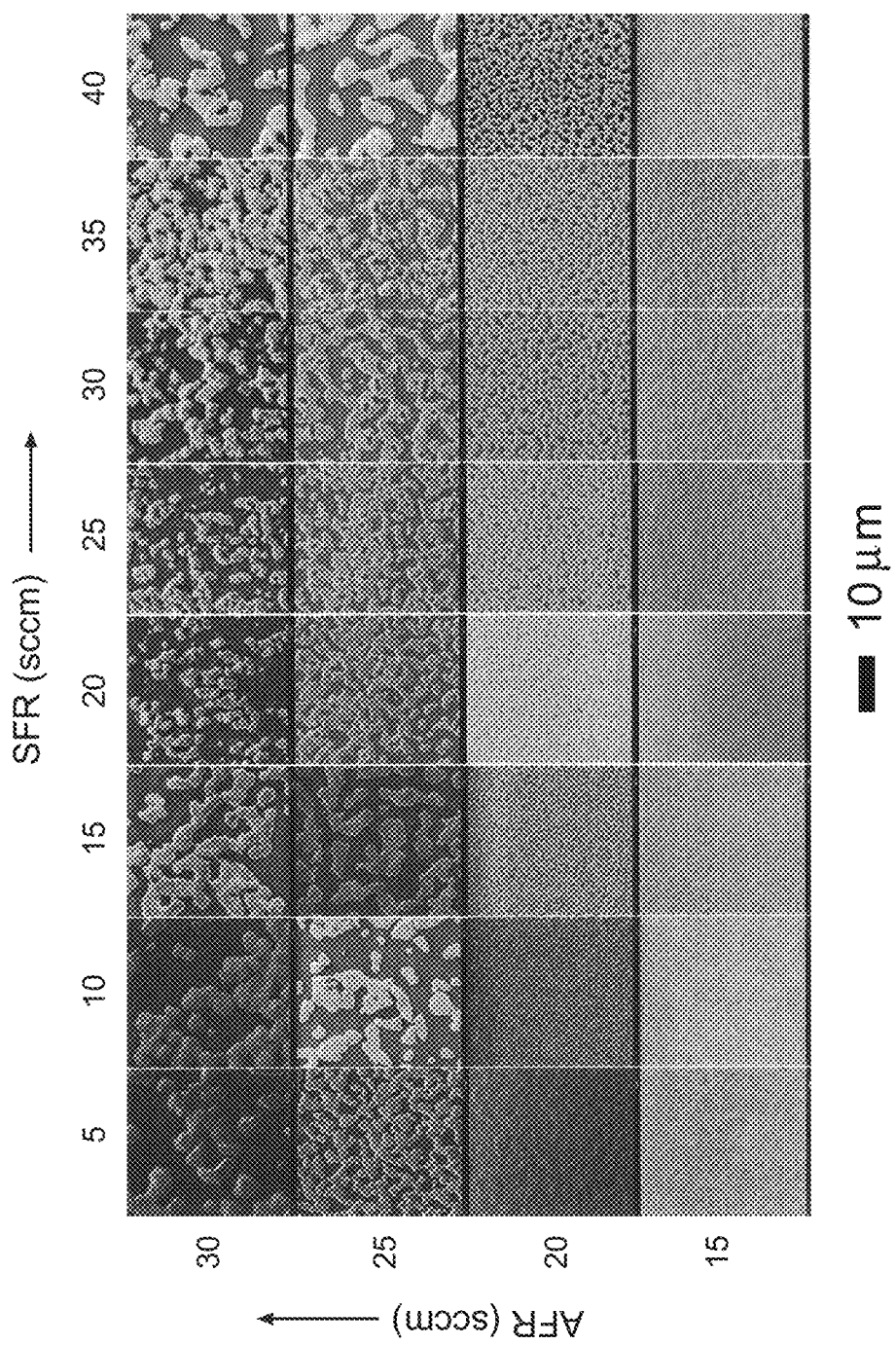

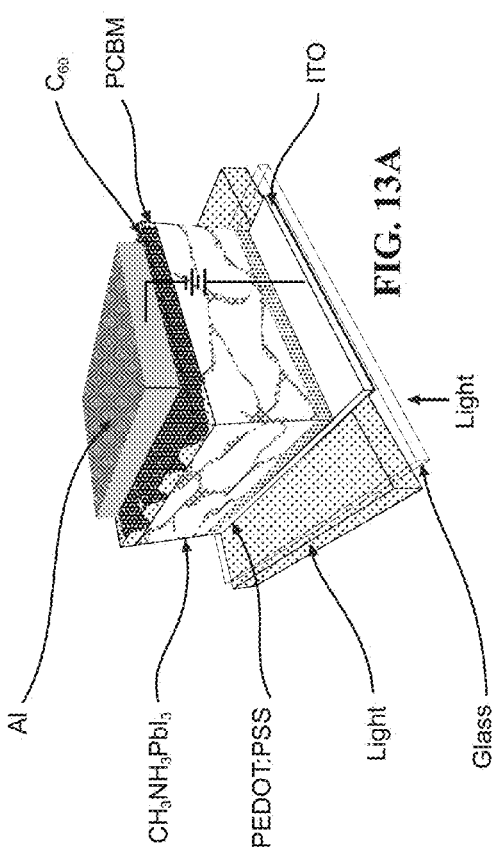
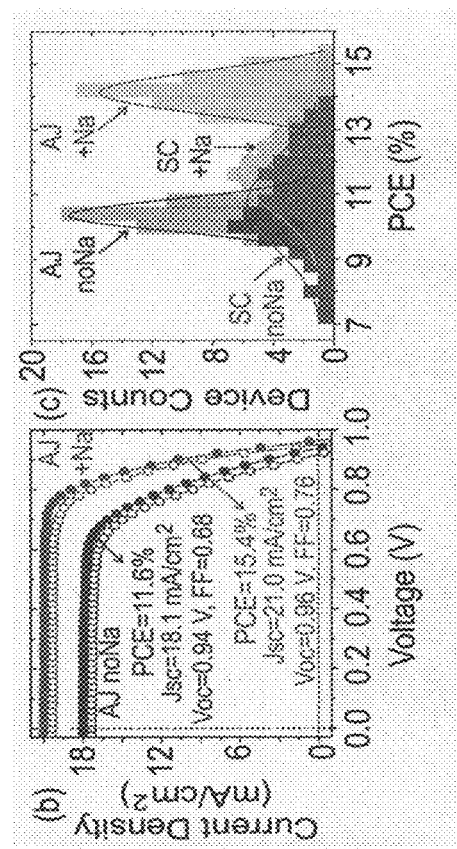
FIG. 13A
FIG. 13B
FIG. 13C

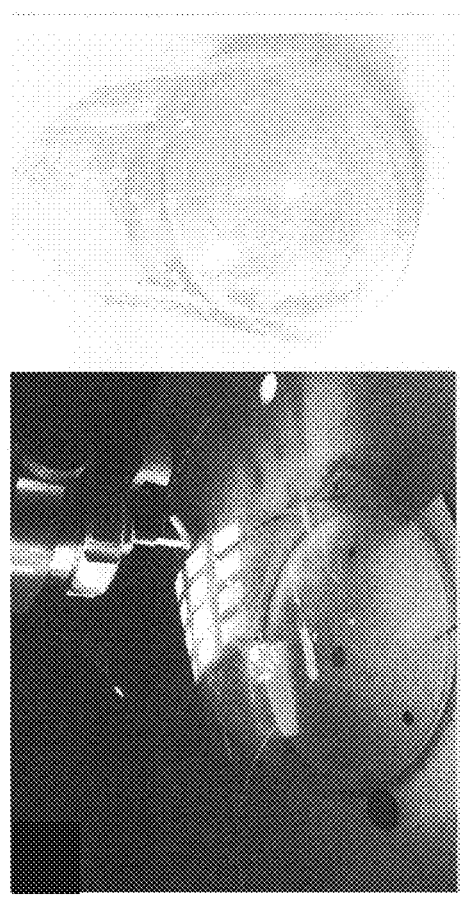
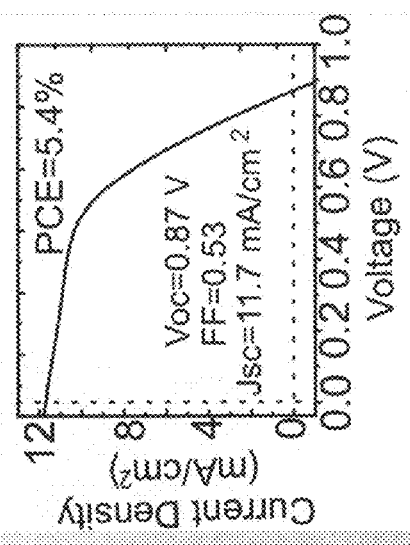
FIG. 15A
FIG. 15B
FIG. 15C
FIG. 15D

DEFECT MITIGATION OF THIN-FILM HYBRID PEROVSKITE AND DIRECT WRITING ON A CURVED SURFACE

Pursuant to 37 C.F.R. § 1.78(a)(4), this application claims the benefit of and priority to prior filed Provisional Application Ser. No. 62/468,734, filed 8 Mar. 2017, which is expressly incorporated herein by reference.

RIGHTS OF THE GOVERNMENT

The invention described herein may be manufactured and used by or for the Government of the United States for all governmental purposes without the payment of any royalty.

FIELD OF THE INVENTION

The present invention relates generally to the manufacture of thin-film hybrid perovskite semiconductors and, more particularly, to the mitigation of defects of thin-film hybrid perovskite semiconductor-based photovoltaics, even when they are written directly on a curved surface.

BACKGROUND OF THE INVENTION

Disruptive photovoltaic (PV) technologies that imitate the principles of digital printing as a means of manufacturing devices offer the promise of low-cost along with the advantages of unique form factors and high throughput processing. Inorganic-organic hybrid, perovskite-based thin-film photovoltaics is a relatively new technology, but it has quickly become a highly impressive contender in this field, underpinned by several impressive characteristics, including high certified device efficiencies, low temperature solution processability, and mechanical flexibility. Additionally, such photovoltaic devices are light weight, comprised of earth-abundant materials, and are chemically tunable. To date, most demonstrations of this technology have been limited to lab scale and based on an extremely labor intensive manual spin-coating process in an inert atmosphere. In order to drive the technology beyond the academic environment and to facilitate further development for commercialization, significant research efforts focused on the 'lab-to-fab' translation of the fabrication methods are needed. Unfortunately, the transfer of device results derived from spin-coated photoactive layers in a standard laboratory setup to fabrication level devices is non-trivial due to the enormous complexity of the thin-film perovskite growth dynamics and the lack of a generic protocol for fabricating high quality, high performing films which would ultimately lead to efficient solar cell devices. Indeed, the active layer's morphology critically influences its optoelectronic properties and, in turn, the overall device PV performance. Furthermore, the optimized perovskite solar cell performances for lab scale, spin-coated devices tend to be highly technique-sensitive as a result of the different mechanisms that drive the active layer film formation.

Accordingly, what is needed is a method for shifting perovskite solar cell fabrication away from the benchtop and toward a more automated, reproducible, and scalable fabrication approach.

SUMMARY OF THE INVENTION

The present invention overcomes the foregoing problems and other shortcomings, drawbacks, and challenges of reproducible production of defect-free, thin-film inorganic-organic hybrid perovskite semiconductors by scalable fabrication methods. While the invention will be described in connection with certain embodiments, it will be understood that the invention is not limited to these embodiments. To the contrary, this invention includes all alternatives, modifications, and equivalents as may be included within the spirit and scope of the present invention.

According to one embodiment of the present invention, a controlled and efficient conversion of $PbI_2$ to defect-free $CH_3NH_3PbI_3$ thin-film by aerosol-jet printing (AJ) is described. The aerosol jet printer has attributes which are advantageous in the field of semiconductors and photovoltaics, including that it is a contactless printing approach, i.e. there is less damage of the underlying layers and applied layers, it is a scalable process, it deposits materials in the form of mist, which allows fine-tuning of material growth very precisely, and it enables the patterning of thin-film depositions. The ultrasonic transducer/atomizer is also an important part of the system. It helps to generate the mist of the precursor ink. In the alternative, it could be replaced by a pneumatic atomizer.

According to another embodiment of the invention, a method for aerosol jet printing a layered perovskite structure comprises: applying a PEDOT:PSS layer to a substrate; applying a layer of lead iodide ($PbI_2$) to the PEDOT:PSS layer; and applying an aerosol mist of methylammonium iodide ($CH_3NH_3I$) atop the $PbI_2$ layer with an aerosol jet nozzle to form a $CH_3NH_3PbI_3$ perovskite film layer.

According to a further embodiment of the invention, the substrate is an ITO glass/polyethylene terephthalate (PET) substrate.

According to another embodiment of the invention, the PEDOT:PSS layer is applied by a process selected from spin-coating, inkjet-printing, slot-die-coating, aerosol jet printing, physical vapor deposition, chemical vapor deposition, and electrochemical deposition.

According to a further embodiment of the invention, the $PbI_2$ layer is applied by a process selected from spin-coating, aerosol jet printing, inkjet-printing, slot-die-coating, physical vapor deposition, chemical vapor deposition, and electrochemical deposition.

According to another embodiment of the invention, the $PbI_2$ for application to the PEDOT:PSS layer is in a DMF solution or a DMSO solution or a γ-butyrolactone solution or a combination of thereof.

According to a further embodiment of the invention, the method for aerosol-jet printing a layered perovskite structure further comprises annealing the $PbI_2$ layer at about 130° C. or lower.

According to another embodiment of the invention, the method for aerosol jet printing a layered perovskite structure further comprises annealing the $PbI_2$ layer at about 80° C. or lower.

According to a further embodiment of the invention, the step of annealing the $PbI_2$ layer is performed in the presence of DMF or DMSO vapor, but these are not required.

According to another embodiment of the invention, the method for aerosol jet printing a layered perovskite structure further comprises annealing the $CH_3NH_3I$ layer at about 80° C. or lower.

According to a further embodiment of the invention, the method for aerosol-jet printing a layered perovskite structure further comprises annealing the $CH_3NH_3I$ layer at about 130° C. or lower.

According to another embodiment of the invention, the step of annealing the $CH_3NH_3I$ layer is performed in the presence of DMF or DMSO vapor, but these are not required.

According to a further embodiment of the invention, the method for aerosol-jet printing a layered perovskite structure further comprises applying a layer of $PC_{71}BM$ atop the $CH_3NH_3PbI_3$ perovskite film layer and annealing at room temperature or above in the presence of residual solvent, e.g. chlorobenzene and/or dichlorobenzene, for a duration of 24 hrs or less.

According to another embodiment of the invention, the method for aerosol jet printing a layered perovskite structure further comprises applying a layer of $C_{60}$ atop the $PC_{71}BM$ film layer.

According to a further embodiment of the invention, the method for aerosol-jet printing a layered perovskite structure further comprises applying a layer of aluminum (Al) atop the $C_{60}$ layer as a top electrode.

According to another embodiment of the invention, the method for aerosol jet printing a layered perovskite structure further comprises adjusting an atomizer flow rate (AFR) of the aerosol-jet nozzle between about 10-25 standard cubic centimeters per minute (sccm).

According to a further embodiment of the invention, the method for aerosol-jet printing a layered perovskite structure further comprises adjusting a sheath flow rate (SFR) of the aerosol jet nozzle between about 5-35 sccm.

According to another embodiment of the invention, the method for aerosol jet printing a layered perovskite structure further comprises forming the aerosol mist of methylammonium iodide ($CH_3NH_3I$) with one of a pneumatic transducer and an ultrasonic transducer.

According to a further embodiment of the invention, the method for aerosol-jet printing a layered perovskite structure further comprises forming an aerosol mist of $PbI_2$ with an ultrasonic transducer; and aerosol-printing the $PbI_2$ aerosol mist with an aerosol jet nozzle.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, which are incorporated in and constitute a part of this specification, illustrate embodiments of the present invention and, together with a general description of the invention given above, and the detailed description of the embodiments given below, serve to explain the principles of the present invention.

FIG. 1A illustrates a simplified diagram for the core parts of an aerosol jet (AJ) printer for perovskite thin-film growth.

FIG. 1B depicts a schematic representation of the process flow used to form $CH_3NH_3PbI_3$ perovskite films in a p-i-n type planar heterojunction device structure.

FIG. 1C depicts an exemplary timing diagram for AJ operation.

FIG. 1D illustrates the direction of the AJ print-head movement relative to the substrate for producing individual rectangular shaped perovskite 'pixel' of predefined size. Patterns are produced using a nozzle with a diameter of 150 µm at a fixed platen temperature.

FIG. 2A Top view SEM images of the 350 nm perovskite films grown on glass/ITO/PEDOT:PSS from compact $PbI_2$ layer under variable AJ printing conditions. Films are annealed at 100° C. for 80 min with DMF vapor after printing.

FIG. 2B depicts digital photographs of printed $CH_3NH_3PbI_3$ films of FIG. 2A on 1 inch×1 inch square substrates.

FIG. 2C illustrates a comparison of XRD patterns of the AJ printed films of FIG. 2A.

FIG. 9A depicts top view SEM images of the 350 nm perovskite films fabricated on glass/ITO/PEDOT:PSS surface from nanoporous $PbI_2$ layer at various AJ printing conditions.

FIG. 9B depicts top view zoom-out SEM images of the 350 nm perovskite films (corresponding to FIG. 9A) grown on glass/ITO/PEDOT:PSS from nanoporous $PbI_2$ layer under variable AJ printing conditions.

FIG. 13A illustrates a planar heterojunction solar cell device structure according to an embodiment of the invention.

FIG. 13B illustrates J-V characteristics of the best-performing devices based on defect-mitigated (AJ printed) perovskite layers by AJ printing of $CH_3NH_3I$ ink with and without NaI additive. Open circles: forward scan, closed circles: reverse scan.

FIG. 13C illustrates distribution of device performance for spin coated (SC) and AJ printed perovskite solar cell devices with and without NaI additive. Gaussian fits for histograms of each device types are overlaid in the same graph.

FIG. 15A depicts a perspective view of a direct printing process of perovskite semiconductor on a hemispherical surface during aerosol jet operation.

FIG. 15B illustrates AJ printed $PbI_2$ on a PET/ITO/PEDOT:PSS surface attached to a hemispherical substrate.

FIG. 15C illustrates AJ printed $CH_3NH_3PbI_3$ on a PET/ITO/PEDOT:PSS surface attached to a hemispherical substrate.

FIG. 15D depicts J-V characteristics of a perovskite solar cell made by direct printing of the photoactive layer on the hemisphere in a PET/ITO/PEDOT:PSS/$CH_3NH_3PbI_3$/PCBM/C60/Al type PHJ device structure.

Figure 3:
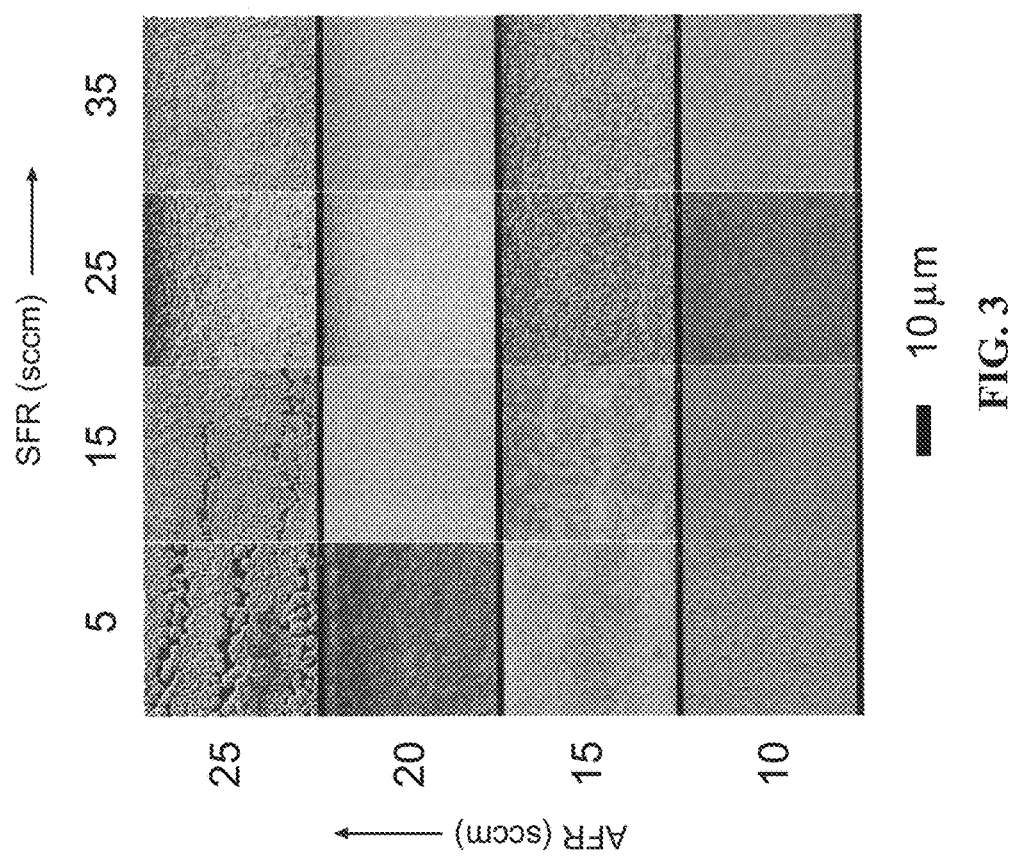
FIG. 3 depicts top view zoom-out SEM images of the 350 nm perovskite films as shown in FIG. 2A. These films are grown on glass/ITO/PEDOT:PSS from a compact $PbI_2$ layer under variable AJ printing conditions

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

The performances of lab-scale, all spin-coated, methyl ammonium lead trihalide perovskite-based solar cell devices are subject to a near infinite level of variation based on individuals' expertise. The photovoltaic properties of perovskite solar cells are highly dependent on the active layer film morphology and crystallization, and as such the controlled deposition of defect-free perovskite films is of significant interest towards wide adoption of this inorganic-organic hybrid technology. Mitigating defects during an all-low temperature, solution processed perovskite thin-film growth through automation is highly desirable to facilitate the lab-to-fab process transfer of this emerging solar technology. Critical to this goal is the implementation of novel fabrication protocols which are robust and which have the advantage of full manufacturing compatibility. As a step forward, an aerosol-jet printing technique is presented herein for precisely controlling the thin-film perovskite growth in a planar hetero junction p-i-n solar cell device structure. Herein we define the parameters for the fabrication of the pure $CH_3NH_3PbI_3$ thin films under near ambient conditions. Preliminary power conversion efficiencies up to 15.4% are achieved when such films are incorporated in a PEDOT:PSS-perovskite-PCBM type device format. The deposition of atomized materials in the form of a gaseous mist helps to form a highly uniform and $PbI_2$ residue-free $CH_3NH_3PbI_3$ film, and offers advantages over the conventional two-step solution approach by avoiding the detrimental solid-liquid interface induced perovskite crystallization. Ultimately, by integrating the full 3D motion control of the aerosol jet printer with this new solid-mist crystallization process, fabrication of perovskite layers may be performed directly on a 3D curved surface. Accordingly, 3D automation in the aerosol jet printing may form a universal platform for the lab-to-fab process transfer of solution based perovskite photovoltaics and steer development of new design strategies for numerous embedded structural power applications.

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Perovskite solar cells have been manufactured using doctor-blading, spray-coating, inkjet-printing, and slot-die coating, while aerosol jet deposition technology has been disfavored or ignored. However, it was discovered that aerosol jet deposition technology is well-suited to deal with the challenges associated with precisely controlling the film morphology, composition, and yield in a fully automated and scalable way. Furthermore, an aerosol jet deposition method was developed which may be used to manufacture uniform, large-grained, high-quality, defect-free perovskite films that possess the fidelity necessary for commercial relevance.

According to an embodiment of the invention, the perovskite precursor inks may be atomized using ultrasonic transduction. Here, high frequency acoustic waves are passed through a small volume (≤1 mL) of the ink and effect a capillary cresting phenomenon at the surface of the ink where very fine (1-2 μm) droplets are emitted. The head space above the ink quickly fills with a dense aerosol which is subsequently picked up and delivered to a nozzle by a controlled flow of an inert 'carrier' gas (e.g. nitrogen). At the nozzle a second gas flow is introduced coaxial to the carrier gas. This 'sheath' flow acts to constrict and collimate the flow of ink-entrained carrier gas such that features much smaller than the nozzle orifice diameter may be produced on the substrate.

Predefined CAD-generated tool paths are executed to realize a fully automated thin-film deposition routine in which 2D or 3D motion control may be achieved and the aerosol may be deposited as defined at any given position in a digital manner. Parameters, such as gas flow rate, print speed, x-y-z motion, and ink and build platen temperatures may be easily defined within the tool path. This method affords a mask-free, digital and scalable thin-film deposition method with minimal waste of starting material and high throughput as compared to the traditional spin-casting motif. Aerosol jet deposition also opens up possibilities for additive manufacturing of thin-film layer stacks on any arbitrary 3D surfaces without cutting or assembling steps. Additionally, the non-contact solvent-free nature and 'jet-on demand' control of the aerosol jet printing (AJP) are advantageous for mitigating defects in multilayer deposition.

In order to explore the effectiveness and reliability of this approach in fabricating inorganic-organic hybrid perovskite films, AJP was used as a deposition technique to fabricate methylammonium lead tri-iodide ($CH_3NH_3PbI_3$)-based single halide films on a low-temperature-processed poly(3, 4-ethylenedioxythiophene):polystyrene sulfonate (PEDOT:PSS) surface under near ambient conditions. Power conversion efficiencies up to 15.4% have been achieved from these aerosol jet printed thin perovskite films using a PEDOT:PSS-perovskite-phenyl-C71-butyric acid methyl ester (PCBM) device configuration through comprehensive print optimization on a planar surface. With regard to the near ambient conditions, the platen temperature is about 70° C., humidity less than 30%, and the atmospheric pressure is ambient. The temperature may be as high as 150° C., but only for a brief time because the material loses stability when it is above about 135° C. for an extended period. A significant difference from the prior art is that the perovskite active layer is neither deposited under vacuum nor in an inert atmosphere.

Direct printing of perovskite layers by aerosol jet deposition on a curved hemispherical surface is also presented herein, and efficiencies of ≈5.4% are achieved using the same planar heterojunction (PHJ) device layout after conforming to a flat surface. The curved piece is flattened solely to measure the efficiency of the device using standard measurement equipment. This is the first time that programmable fabrication of perovskite solar cells on a curved surface has been accomplished using a direct printing approach. Accordingly, fully automated, CAD-controlled aerosol jet printing is not only a promising option for the 'lab-to-fab' process transfer of the solution-processed perovskite PV technology, but may also be utilized to integrate solar cells directly onto any arbitrary 3D substrate/structure.

FIG. 1A depicts a schematic illustration of the aerosol jet deposition system 100 that may be used to print a perovskite active layer 102. The deposition of each of the precursor components, e.g. lead iodide ($PbI_2$) and methyl ammonium iodide ($CH_3NH_3I$), may be automated, avoiding the more-variable manual process optimization steps commonly practiced using spin-coating processes. The system 100 may be simplified to five main components; the ultrasonic atomizer source 104, the print head 106, the motion stage 108, flow controllers 110, and motion controllers 112. FIG. 1A depicts a simplified diagram for the core parts of the aerosol jet (AJ) printer 100 perovskite thin-film growth. The key parameters optimized in this work are the ink formulation, atomizer flow rate and sheath flow rate.

The ultrasonic atomizer source 104 may be comprised of a temperature-controlled ink reservoir 114 with an integrated ultrasonic transducer 116. This is where the aerosol 118 is generated and entrained into the carrier gas 120. The print head 106 may contain the print nozzle assembly 122 and the process shutter 124 and may be capable of motorized motion along the z-axis. Since the response time of the flow of aerosol-entrained gas may be very slow (30-300 s for steady-state), an integrated process shutter 124 may be employed as a switchable physical barrier to effectively turn on and off deposition of the ink. Introduction of the sheath gas 126 and aerosol collimation occurs within the print nozzle assembly 122 where both the ink-entrained carrier gas 120 and sheath gas 126 flows are coaxially combined. Mounted on the x and y motion stages 108 is a heated vacuum platen 128 where substrates 130 may be translated with high accuracy beneath the nozzle 122. Flow controllers 110 and motion controllers 112 may utilize PID feedback to accurately deliver gas flow rates and motion, respectively, as dictated by the user and/or tool path. The whole set up may be fully automated so that the movements of the substrate 130 and print head 106, gas flow rates, atomization intensity, temperatures, and shutter operation may be precisely managed to make fabrication consistent and reliable across different regions, i.e. different areas of a substrate, and multiple devices. Tool paths 132 to produce desired printing features may be generated either by AutoCAD drawings or by manual programming.

The AJP system offers the operator wider control over process parameters which enables greater flexibility in film fabrication and device layout. Films of $CH_3NH_3PbI_3$ were fabricated as a model for hybrid perovskite photoactive layer to investigate the aerosol-solid crystallization process between two precursor components, $PbI_2$ and $CH_3NH_3I$, each of which may be applied as an aerosol mist. Film morphology, chemical composition, and grain boundaries in the films were scrutinized systematically to generate a controllable approach for mitigating defects in a sequential deposition process under near ambient conditions. With regard to the near ambient conditions, the platen temperature is about 70° C., humidity less than 30%, and the atmospheric pressure is ambient. A significant difference from the prior art is that the perovskite active layer is neither deposited under vacuum nor in an inert atmosphere. According to an embodiment of the invention, the sequential deposition approach was utilized to deposit the precursor components. This approach was also augmented by incorporating the full system automation and non-contact nature of the aerosol-jet printer.

In this example, a methyl ammonium iodide (MAI, $CH_3NH_3I$) aerosol mist 118 is generated from its precursor ink (from ink reservoir 114) using the ultrasonic transducer (atomizer) 116 and subsequently jetted onto a $PbI_2$ film 134 using pre-programmed deposition routines. The process steps are illustrated in FIG. 1B. FIG. 1B presents a schematic representation of the process flow used to form $CH_3NH_3PbI_3$ perovskite films in a p-i-n type planar heterojunction device structure. In the first step (140), a thin film of $PbI_2$ 134 is deposited onto a PEDOT:PSS coated glass/ITO substrate 136 using either spin casting or AJP. The precise conversion of the solid $PbI_2$ layer 134 to $CH_3NH_3PbI_3$ 138 may be achieved via an in-situ solid-mist-solid phase transformation process upon the application of the $CH_3NH_3I$ aerosol mist 118 from ink reservoir 114.

The detailed film deposition and device fabrication process are described below. Briefly, commercial PEDOT:PSS is spin cast onto a glass/ITO surface to form a hole transport layer (HTL). For morphological evolution studies, a solution of $PbI_2$ in N,N-dimethylformamide (DMF) was subsequently spin-cast on top of the HTL where variations of the desired PbI$_2$ film morphologies were achieved by drying the wet PbI$_2$ film at varying rates (e.g., 5 min for compact PbI$_2$ and 12 min for nanoporous PbI$_2$ layer) immediately after spin-casting. Next, the solid PbI$_2$ layer 134 was converted to CH$_3$NH$_3$PbI$_3$ 138 by introducing MAI in aerosol form 118 from the AJP system 100. FIG. 1C presents a timing diagram for the present AJ operation. The timing diagram (FIG. 1C) summarizes a series of automated process steps demonstrating how the atomized ink 118 may be patterned at predefined locations onto the substrate 136. Patterning may be achieved using x/y motion control stages 108 which move the substrate 136 at a velocity of 30 mm/s under a (laterally) fixed nozzle 122. FIG. 1D depicts the direction of the AJ print-head movement relative to the substrate for producing individual rectangular shaped perovskite 'pixel' of predefined size. Patterns are produced using a nozzle with a diameter of 150 μm at a fixed platen temperature. For this work, around 50 μm traces are deposited in a 10 μm pitch raster pattern (FIG. 1D) in order to fill predefined square/rectangular areas referred to herein as 'pixels'. At low temperature annealing conditions, e.g. 80-110° C., these overlapping traces coalesce to form a continuous film 134.

The aerosol jet deposition approach, which is novel for perovskite film growth, precludes many of the detrimental events (e.g. the formation of the needle-forming solvated CH$_3$NH$_3$PbI$_3$.DMF intermediate phase, dissolution of film, etc.) which are commonly observed in conventional solution-based perovskite deposition processes. The elimination of these detrimental events is likely due to the exquisite control afforded by this technique in precisely depositing metered quantities of perovskite precursors in the form of aerosol-mists such that grain growth, perovskite conversion, and final film morphology may be parametrically controlled. Advantageously, the thin-film microstructural features are tunable simply by adjusting some of the common parameters (i.e. atomizer and sheath gas flow rates) in the AJD system 100.

In order to effectively atomize and deposit MAI 118 using AJP, an appropriate formulation having the desired rheology, volatility, and concentration was established where 2 wt % MAI was combined with a 1:3 (v/v) mixture of IPA (isopropyl alcohol) and DMF (dimethylformamide). Here, the MAI 'ink' 118 was deposited on spin-cast films of PbI$_2$ 134 and the atomizer and sheath gas flow rates were systematically varied between 5-35 sccm. The compositional and morphological evolution of the resultant perovskite layer 102 was monitored using a series of X-ray diffraction (XRD) and scanning electron microscopy (SEM) measurements to elucidate the aerosol-solid crystallization process. The aerosol-solid crystallization process may be performed in air at 70° C. with a relative humidity of <30%, for example. In one example, the atomizer flow rate (AFR) was increased progressively from 10 sccm to 25 sccm in 5 sccm increments, and the sheath flow rate (SFR) was swept from 5 sccm to 35 sccm in 10 sccm increments. In order to isolate the effects of varying these flow rates, all other parameters of the AJP system 100 were kept fixed throughout the printing process.

Fabrication of thin-film perovskite solar cells. All traditional, planar thin-film perovskite solar cell devices were fabricated on patterned indium-doped tin oxide (ITO) glass (Sheet resistance of 15Ω/□) substrates. On the day of deposition, the ITO glass substrates were cleaned sequentially by sonicating with detergent, deionized water, acetone, and isopropanol (IPA), followed by drying with high flow of nitrogen and UV-ozone treatment for 20 min. Filtered (0.45 micron PVDF filter) poly-(3,4-ethylenedioxythiophene:poly (styrenesulfonic acid) (PEDOT:PSS) was spin coated onto the clean ITO glass substrates at 3000 rpm for 60 s and then dried on a ceramic hot-plate at 160° C. for 15 min in ambient atmosphere. Thereafter, CH$_3$NH$_3$PbI$_3$ active layer was fabricated by a two-step sequential deposition method with the help of a commercial aerosol-jet printer. First, hot PbI$_2$ (dissolved in anhydrous dimethylformamide (DMF) at 75° C., 400 mg/ml concentration) solution was spun on the top of the glass/ITO/PEDOT:PSS by a spin-coater at a spin rate of 6000 rpm for 35 s and the resulting PbI$_2$ layer was dried in a closed container for 0 to 12 min duration at room temperature followed by a mild annealing at 80° C. for 10 min on a hot plate. The presence of residual DMF solvent in the film before this annealing step promotes crystal growth and the longer the growth time (hold time of the film in the closed container immediately after spin-coating) the larger is the crystal growth resulting in formation of nanoporous structures in the film. The extent of nanopore generation can be quenched by annealing the film immediately after spin-coating. Thus PbI$_2$ films with different microstructures were obtained at this stage by drying the spin-coated layers differently. The CH$_3$NH$_3$I aerosol mist was generated from a solution containing 2 wt % CH$_3$NH$_3$I in IPA:DMF (1:3, v/v) mixture by an aerosol jet printer using ultrasonic transduction and was subsequently deposited onto the solid PbI$_2$ layer in air with variable atomizer and sheath flow rates (nozzle diameter: 150 μm, x-y stage movement speed: 30 mm/s, relative humidity below 30%). For additive based printing, a small amount (2 mol %) of sodium iodide is added in the CH$_3$NH$_3$I formulation (in IPA:DMF). The platen temperature was maintained at 70° C. throughout the printing process. The timing diagram of the printing process and the line pattern (at 10 μm spacing) of the jetted aerosol-mist are shown in FIGS. 1C-1D respectively. The printed PbI$_2$ layer was made similarly by the same aerosol jet printer from a 10 wt % PbI$_2$ solution in DMSO. The PbI$_2$ layer rapidly changed its color from light yellow to dark brown at predefined square/rectangular areas after exposure to the sufficient amount of aerosolized CH$_3$NH$_3$I mist. Next, the printed samples were then taken into a N$_2$ filled glove box where remaining device fabrication and measurement steps were carried out. To enhance crystallization and perovskite conversion, the samples were annealed on a hot plate at 100° C. for 80 min with a drop of DMF covered with a glass lid. After the annealing step, a thin layer of PC$_{71}$BM (20 mg/ml in dichlorobenzene) was deposited on the top of the CH$_3$NH$_3$PbI$_3$ layer by spin-coating at the speed of 6000 rpm or less for 40 s and then solvent annealed (in a dichlorobenzene rich environment) at room temperature overnight. Ultimately, the device was finished by thermal evaporation of C$^{60}$ (30 nm) and Al (150 nm). The active area of each device is 0.1 cm$^2$, measured by the overlap of top Al electrode and ITO. The performance of these devices were compared to devices made from traditional two-step spin-coated perovskite layer in air where the respective MAI inks (4 wt % in anhydrous IPA with and without additive) were dripped onto the similar PbI$_2$ layer during spinning at high rate (6000 rpm). All other fabrication steps were kept same.

For aerosol jet printing of perovskite on a curved surface, first PEDOT:PSS was deposited on a precleaned and UV-ozone treated PET/ITO (surface resistivity of 60 ohm/sq.) substrate by spin-coating. After the coating was completely dried by baking at 160° C. for 15 min, the coated PET substrate was wrapped around a hemispherical substrate and glued as shown in FIG. 15B. Using AutoCAD design files, PbI$_2$ and CH$_3$NH$_3$I were sequentially deposited onto this curved substrate, directly without any disassembly step by the aerosol jet printer. Then after detaching the coated PET from the hemisphere and conforming to a flat surface, the stacked PET/ITO/PEDOT:PSS/PbI$_2$/CH$_3$NH$_3$I layers were taken inside a glove box where full solar cells were constructed afterwards using the same processing protocols and device geometry as the reference cells made on the ITO-coated glass. During the full device fabrication, wherever spin coating steps were applied for thin-film deposition (i.e. PEDOT:PSS and PCBM), the bottom of the PET substrate was attached to a flat, rigid base (e.g. glass) to prevent distortion of the flexible PET. After spin-coating, the PET substrate was carefully peeled off from the base. Irrespective of the substrate, J-V characteristics of all fabricated devices were measured similarly using a Keithley 2410 source measure unit under a simulated AM 1.5G spectrum under N$_2$ inert atmosphere.

FIG. 2A depicts top view SEM images of the 350 nm perovskite films grown on glass/ITO/PEDOT:PSS from compact PbI$_2$ layer under variable AJ printing conditions. In these examples, the films are annealed at 100° C. for 80 min with DMF vapor after printing. In all images, scale bars are 2 μm. FIG. 2B depicts digital photographs of the corresponding printed CH$_3$NH$_3$PbI$_3$ films on 1 inch×1 inch square substrates. FIG. 1C illustrates comparisons of XRD patterns of the AJ printed films.

FIG. 2A depicts top view SEM images of the PbI$_2$ film 134 after aerosol jet deposition of MAI 118. These images (pixels ①-⑫) reveal morphological variations for different gas flow rates and clearly demonstrate that film morphology is largely dependent on both the atomizer flow rate (AFR) and the sheath flow rate (SFR). The PbI$_2$ layer (≈240 nm) depicted in FIG. 2A, any of pixels ①-④-, has a compact bulk morphology with a somewhat spiny and wart-like surface texture, which is formed by drying the wet PbI$_2$ naturally for about 5 min after spin-coating followed by rapid thermal quenching. Rapid thermal quenching may involve annealing at about 80° C. for about 10 min to stop the crystallization of PbI$_2$ in the left-over solvent after spin-coating. FIG. 2B depicts optical images of the printed perovskite films after aerosol jet deposition of the MAI film 134 for various jetting conditions. For samples where the MAI film 134 was deposited using an AFR of 10 sccm there is arguably no visible change in film texture (the bottommost row, images 1-4). This may be due to an extremely low deposition rate for these flow settings. As the AFR increases the PbI$_2$ film color changes from light yellow to brown and ultimately to dark brown suggesting a gradual conversion of the PbI$_2$ to perovskite. FIG. 3 depicts top view SEM images of the PbI$_2$ film 134 after aerosol jet deposition of MAI 118.

Figure 4:
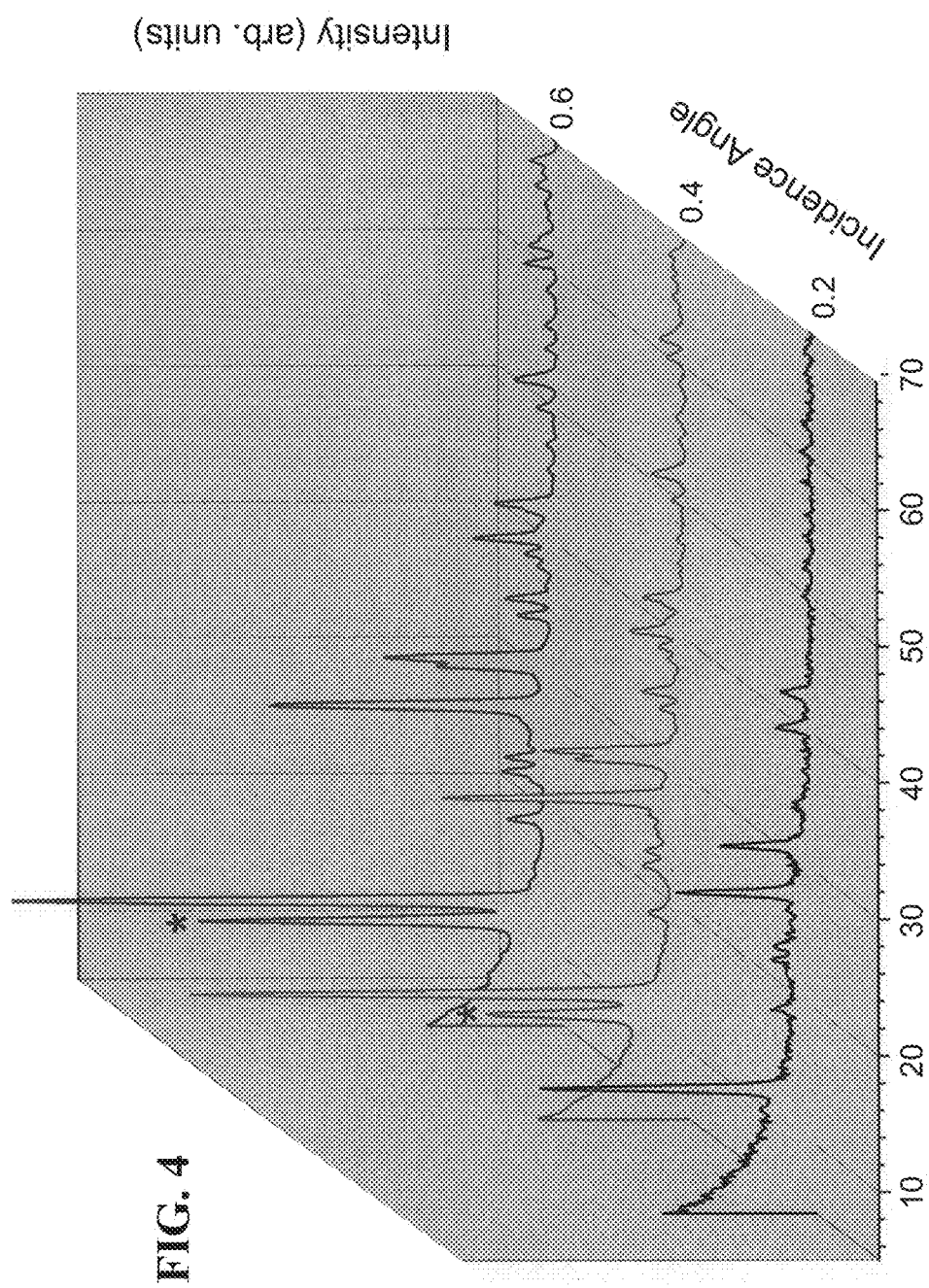
FIG. 4 depicts grazing incidence X-ray diffraction (GIXRD) patterns as a function of x-ray incidence angle for an MAI deposited film (pixel ⑩ in FIG. 2A) on a compact $PbI_2$ layer by aerosol jet printing. The (*) mark indicates presence of $PbI_2$ impurity phase, the relative intensity of which increases with incidence angle.
Figures 5A, 5B, 5C:
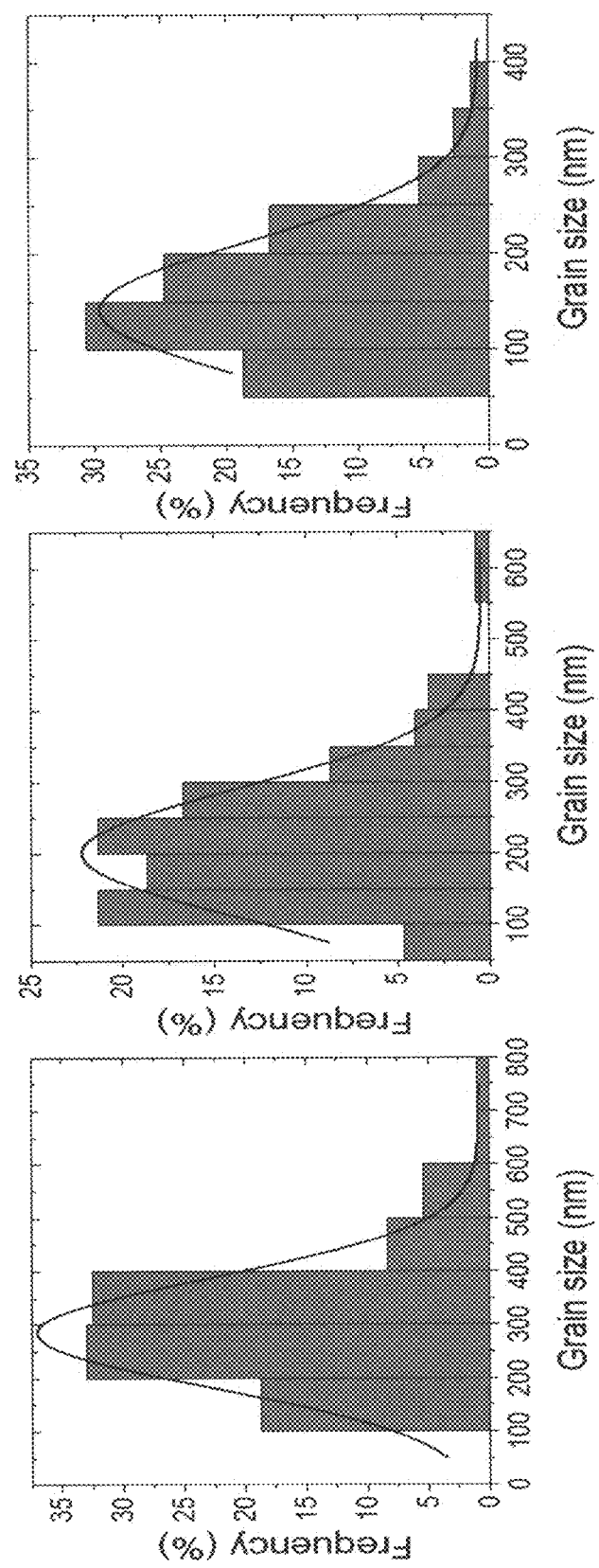
FIGS. 5A-5C depict grain size distributions of the MAI aerosol deposited films on compact $PbI_2$ layers as measured from the SEM images in FIG. 2A (panels a, b, and c correspond to pixels ⑩, ⑪, and ⑫, respectively), wherein the average grain size was derived by fitting the data with Gaussian distribution.

To further understand these findings, x-ray diffraction data (XRD) was collected for pixels ⑤-⑬ and is illustrated in FIG. 2C. While the optical micrographs of FIG. 2C indicate some conversion of PbI$_2$ to perovskite in a diffused form at an AFR of 15 and a SFR of 5 (pixel ⑤), perovskite concentrations only reach x-ray detection limits beginning in pixel ⑦. The diffraction peaks at 2θ of 12.7°, 25.5°, and 38.6°, which are indicative of the hexagonal lattice of PbI$_2$, are still predominant in the film. Increasing the SFR further towards 35 sccm with the same 15 sccm AFR slowly increases the perovskite content in the film, and the diffused pattern is gradually converted to more discrete ones. Consequently, the characteristic (110), (220), and (330) diffraction peaks of the 3D tetragonal perovskite phase at 2θ of 14.1°, 28.4°, and 43.1° become stronger and sharper. (110), (220), and (330) refer to the crystallographic diffraction planes or the Miller indices. In pixel ⑩, at an AFR of 20 sccm and a SFR of 15 sccm, a complete conversion of PbI$_2$ to CH$_3$NH$_3$PbI$_3$ with full coverage is observed on the top film surface by SEM, as evidenced by FIG. 4, which depicts angle dependent grazing incidence x-ray diffraction data. In particular, FIG. 4 depicts grazing incidence X-ray diffraction (GIXRD) patterns as a function of x-ray incidence angle for an MAI deposited film (pixel ⑩ of FIG. 2A) on a compact PbI$_2$ layer by aerosol jet printing. The (*) mark indicates presence of PbI$_2$ impurity phase, the relative intensity of which increases with incidence angle. The XRD data shows the presence of PbI$_2$ phase in the bulk of the film. Jetting at a higher SFR results in improved perovskite conversion, but a concomitant decrease in average grain size from 300 nm in pixel ⑩ to 200 nm in pixel ⑪, and ultimately to 140 nm in pixel ⑫, as depicted in FIG. 5. FIG. 5 depicts grain size distributions of the MAI aerosol deposited films on compact PbI$_2$ layers as measured from the SEM images in FIG. 2A (panels a, b, and c of FIG. 5 correspond to pixels ⑩, ⑪, and ⑫ of FIG. 2A, respectively). The average grain size was derived by fitting the data with Gaussian distribution.

A complete consumption of PbI$_2$ peak is noticed in the XRD pattern at 25 sccm AFR (pixel ⑬ of FIG. 2A). Unfortunately, at this high AFR the film suffers from extremely poor surface coverage which may be detrimental to its use in device level optimization. Meanwhile, upon further increase in SFR a little improvement of the film coverage is noticeable at some localized positions and a set of strong peaks arising from tetragonal perovskite phase is still detected (see pixels ⑭-⑯ of FIG. 2A). The XRD patterns of pixels ⑭, ⑮, and ⑯ are same as those in pixel ⑬, and are not shown in FIG. 2A in order to avoid a cluttered diagram.

Figures 6A, 6B, 6C:
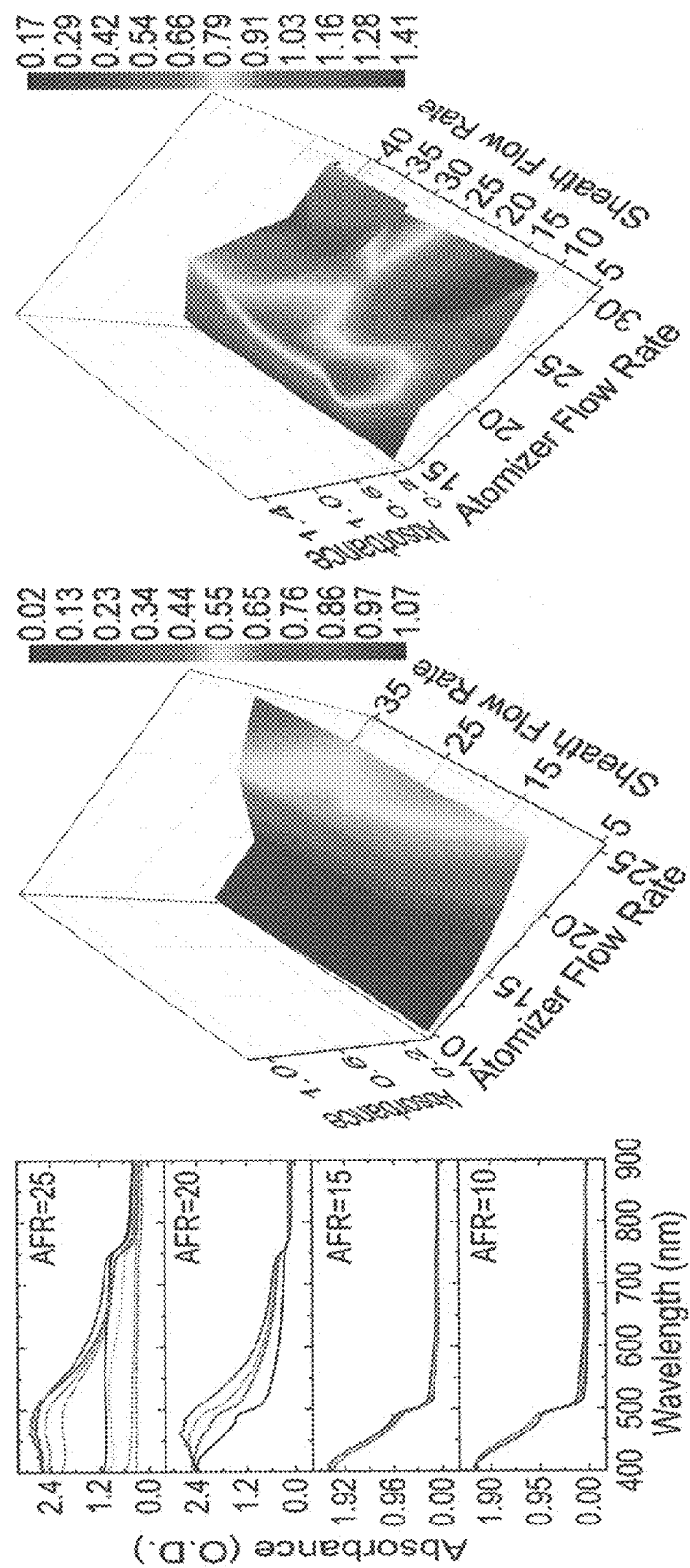
FIG. 6A depicts UV-visible absorption spectra of AJ printed perovskite films based on the conditions as shown in FIG. 2A (black line: SFR=5, red (circle) line: SFR=15, green (square) line: SFR=25, blue (triangle) line: SFR=35; all flow rates are in sccm unit=standard cubic centimeters per minute). At a higher atomization flow rate (i.e. 25 sccm), films become non-continuous which leads to uneven light absorption across film (dotted lines imply measurements on different areas of the sample). 3D views for evolution of UV-visible absorbance at 720 nm wavelength as a function of AFR and SFR made from (b) compact $PbI_2$ and (c) nanoporous $PbI_2$ layers. All flow rates are in sccm unit and absorbances are in O.D. Two depictions of FIG. 6A are presented for clarity.
FIG. 6B illustrates a 3D view for evolution of UV-visible absorbance at 720 nm wavelength as a function of AFR and SFR made from compact $PbI_2$ layers.
FIG. 6C illustrates a 3D view for evolution of UV-visible absorbance at 720 nm wavelength as a function of AFR and SFR made from nanoporous $PbI_2$ layers.
Figure 7:
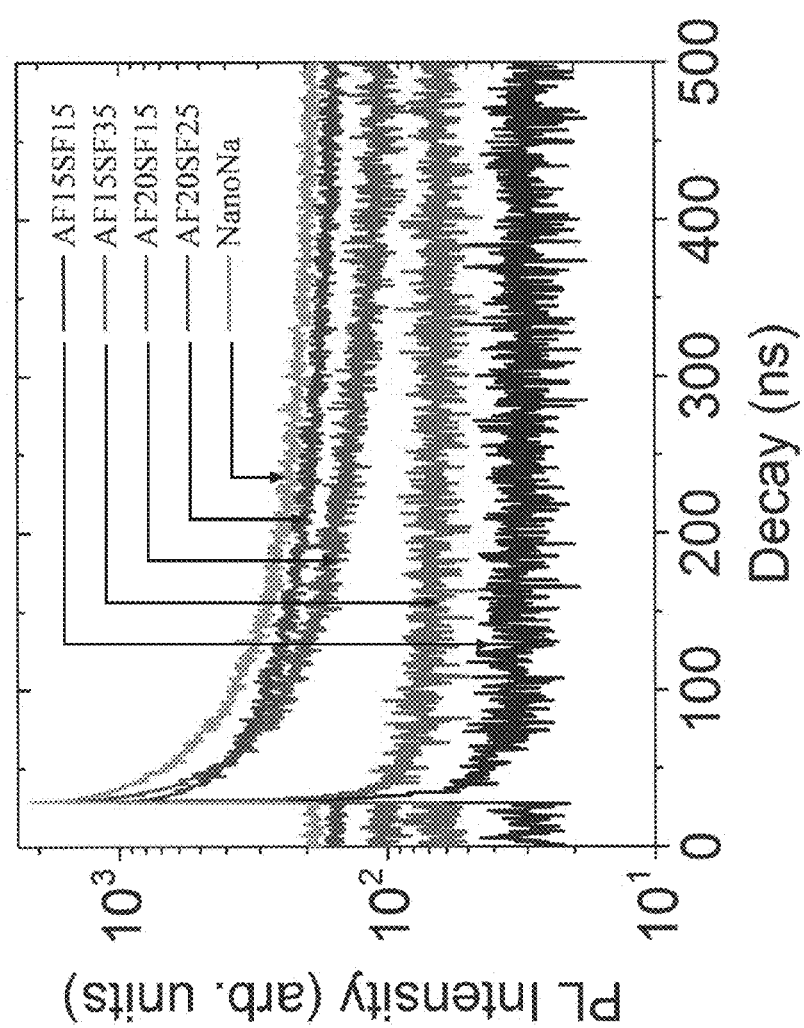
FIG. 7 illustrates time-resolved photoluminescence (TRPL) spectra of perovskite layers on glass taken at peak emission wavelength of 770 nm.

The UV-Visible absorption spectra of the films in FIG. 2B are displayed in FIG. 6A. Irrespective of the SFR, all the films prepared at low atomization flow rates (AFR of 10 and 15 sccm) exhibit (FIG. 6A) a strong light absorption in the UV-blue range with a cut-off edge at ≈510 nm corresponding to PbI$_2$. The absorption intensity is enhanced when the AFR is increased to 20 sccm and upon further rise in the SFR the sharp band-edge region gradually broadens across the visible region with a shoulder at 800 nm, which indicates the formation of perovskite. However, as the AFR increases from 20 sccm to 25 sccm, pinholes and uncovered glass/ITO/PEDOT:PSS surfaces begin to appear (see pixels ⑬-⑯), which ultimately results in full transmission of light through the uncovered regions of the substrate. The evaluation of the absorbance at 720 nm versus flow rates is illustrated in FIG. 6B and reveals its progressive rise with increasing flow rates indicating perovskite conversion. FIG. 6C is similar to FIG. 6B, but corresponds to the films depicted in FIGS. 9A and 9B. In addition, the gradual transformation of PbI$_2$ to perovskite provides longer carrier lifetimes as analyzed by the time resolved photoluminescence (TRPL) decay curves of the printed samples on glass as presented in FIG. 7 and Table 1 below.

TABLE 1

Fitted parameters of TRPL (the values of the goodness-of-fit parameter ($\chi^2$) are shown as well) where $$I(t) = \sum_{i=1}^{i=3} A_i \exp\left(-\frac{t}{\tau i}\right)$$

| Sample* | $A_1$ (%) | $\tau_1$ (ns) | $A_2$ (%) | $\tau_2$ (ns) | $A_3$ (%) | $\tau_3$ (ns) | $\tau_{avg}$ | $\chi^2$ |
|---|---|---|---|---|---|---|---|---|
| AF15SF15 | 38.36 | 1.08 | 61.64 | 22.52 | — | — | 14.30 | 1.029 |
| AF15SF35 | 30.16 | 1.05 | 69.84 | 34.55 | — | — | 24.45 | 1.076 |
| AF20SF15 | 6.44 | 5.13 | 34.43 | 29.4 | 59.14 | 136 | 90.88 | 1.010 |
| AF20SF25 | 5.55 | 3.03 | 24.83 | 19.5 | 69.62 | 131 | 96.21 | 1.054 |
| NanoNa | 4.42 | 5.25 | 20.54 | 32.79 | 75.04 | 188 | 148.04 | 1.065 |

(*AF stands for atomizer flow and SF stands for sheath gas flow; thus film printed with an atomizer flow rate of 15 sccm and a sheath gas flow rate of 15 sccm is denoted by AF15SF15. Other films are named similarly. NanoNa refers to a representative AJ printed perovskite film made from nanoporous $PbI_2$ layer and having sodium additive in the MAI ink. Record power conversion efficiency PHJ devices (>13%) were made from similarly processed films.)

Figure 8:
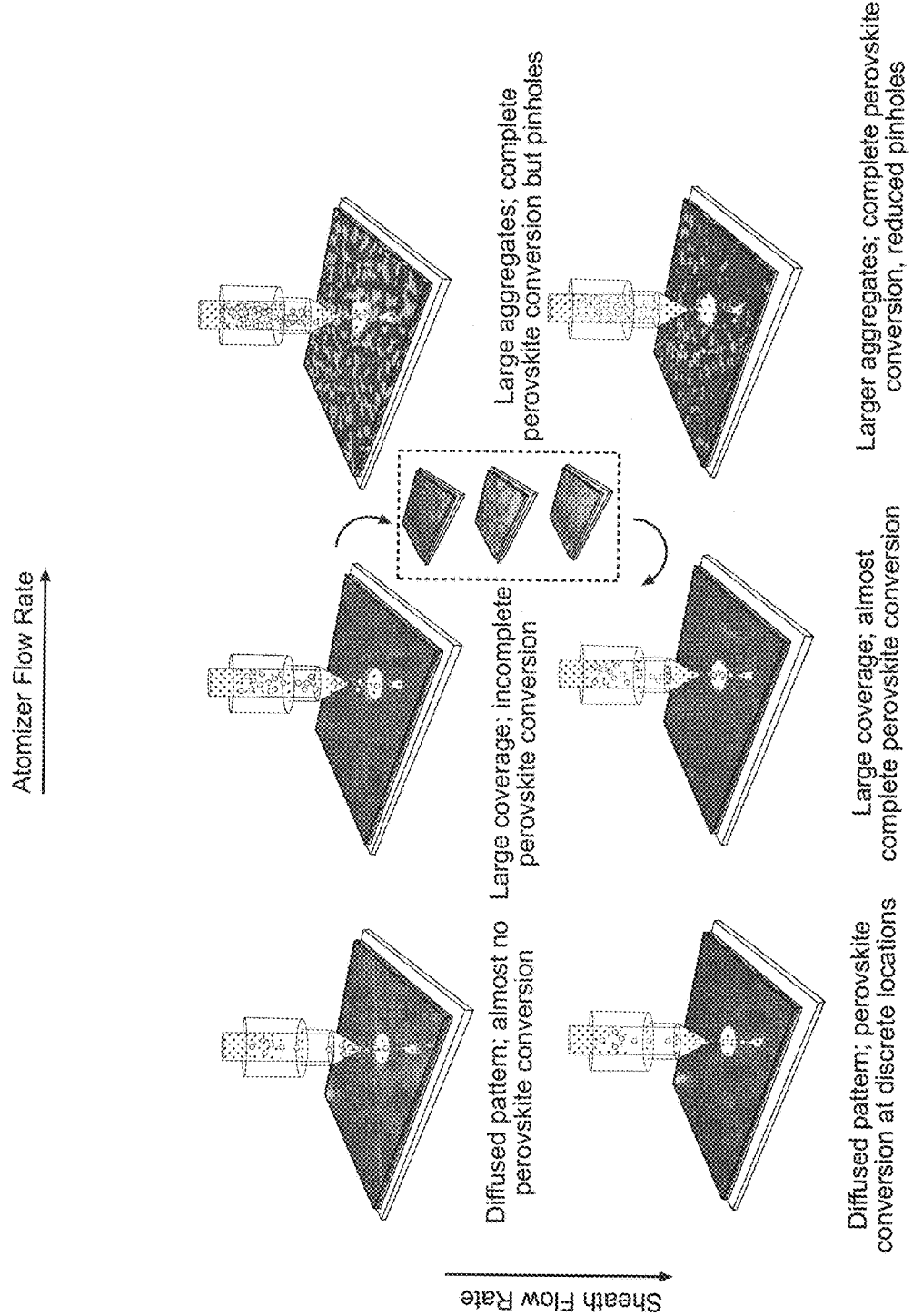
FIG. 8 illustrates general trends related to hybrid perovskite formation at the mist-solid interface, and how the thin-film morphology may be engineered by manipulating the gas flow rates of the AJP system

These results demonstrate general trends related to hybrid perovskite formation at the mist-solid interface, and how the thin-film morphology may be engineered by manipulating the gas flow rates of the AJP system 100. These are summarized and briefly illustrated through a series of simple sketches in FIG. 8. Three different AFR test conditions, low (left column), medium (middle column), and high (right column), are presented in this scheme. At low AFRs and SFRs, only a very small amount of MAI aerosol is carried to the nozzle and low levels of aerodynamic focusing are achieved. These conditions produce a diffuse cloudy appearance on the $PbI_2$ film with almost no perovskite conversion. When the SFR is increased, the aerosol stream becomes more focused and aerosol droplets are better able to coalesce, accumulate, and penetrate the $PbI_2$ film as they reach the surface. However, at lower AFRs, only limited quantities of the MAI mist are supplied resulting in non-contiguous deposition. As such, perovskite conversion is intermittent and irregular. In maintaining a moderate AFR while increasing the SFR, the $PbI_2$ films, augmented by a serial change in average grain size, gradually turn into $CH_3NH_3PbI_3$ perovskite phase with full surface coverage. Here with gradual rise in the SFR, at first, grains with less-pronounced boundaries are formed, which then change to flat polygonal forms with triple junction boundaries and ultimately to smaller grains. This may be due to the rapid drying of the aerosol-mist and accelerated nucleation of perovskite on the PEDOT:PSS after the chemical reaction between solid $PbI_2$ and MAI aerosol-mist with increased SFR. Finally, depositing MAI mist at high AFR causes partial dissolution of the underlying $PbI_2$ film as higher deposition rates result in pooling of the ink on the surface of the $PbI_2$ film. Although this ensures complete conversion of $PbI_2$ to $CH_3NH_3PbI_3$, it redistributes the $PbI_2$ resulting in non-uniform and incomplete perovskite film coverage. Therefore, only at moderate atomizer and sheath flow rates the appropriate balance between film morphology and perovskite conversion can be accomplished.

Figure 10:
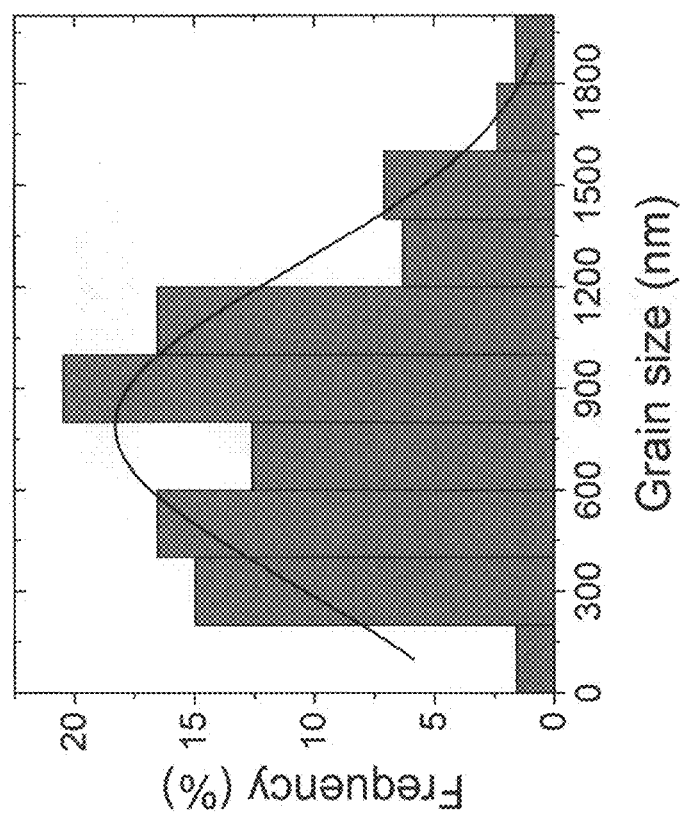
FIG. 10 illustrates grain size distribution of the MAI aerosol (AFR: 20 sccm and SFR: 15 sccm) deposited film on nanoporous $PbI_2$ layer as measured from the SEM image in FIG. 9A.

The morphology of $PbI_2$ layer influences the crystallization of $CH_3NH_3PbI_3$. For a two-step sequential deposition scheme, the conversion and morphology of the final perovskite film is strongly dependent on the initial quality of $PbI_2$ layer. A diffusion facilitated support medium enables efficient transport of MAI into the bulk of $PbI_2$ layer, leading to its rapid and high conversion to $CH_3NH_3PbI_3$. As opposed to the compact $PbI_2$ layer, discussed previously, we will now present the use of nanoporous $PbI_2$ for the evolution of perovskite by AJP. These nanoporous $PbI_2$ layers were generated by simply increasing the $PbI_2$ drying rate after its deposition by spin-coating. SEM surface images in FIG. 9A and FIG. 9B depict (gas) flow rate dependent controlled transformation of nanoporous $PbI_2$ to perovskite and reveal similar trend of continuous conversion of $PbI_2$ to $CH_3NH_3PbI_3$ with increasing gas flow rates as observed for compact $PbI_2$ (see FIG. 6C). A notable difference is the formation of larger size perovskite grains from nanoporous $PbI_2$ at a medium flow rate (AFR: 20 sccm, SFR: 10 sccm). No $PbI_2$ impurity phase is detected in the XRD pattern, confirming complete conversion of $PbI_2$ to $CH_3NH_3PbI_3$. Using identical AJP parameters, the average grain size substantially increases from ≈300 nm to ≈800 nm (see FIG. 5(a) and FIG. 10) after switching to nanoporous $PbI_2$ from compact $PbI_2$. While the growth of such large grains could benefit the charge transport proper-ties of the perovskite film, it accompanies small crevices in the film and thus could reduce the shunt resistance of fabricated planar solar cell devices. Here in the porous $PbI_2$ layer, $CH_3NH_3PbI_3$ grows three-dimensionally due to facile diffusion of ions, which creates variable size gaps between adjacent $CH_3NH_3PbI_3$ grains. Therefore, the results in FIG. 9A suggest that if the formation of these gaps and crevices can be mitigated, an AFR of 20 sccm with a SFR of around 10-15 sccm on a nanoporous $PbI_2$ surface is likely to be the most promising printing condition to fabricate high quality perovskite films suitable for efficient solar cell devices.

Figure 11B:
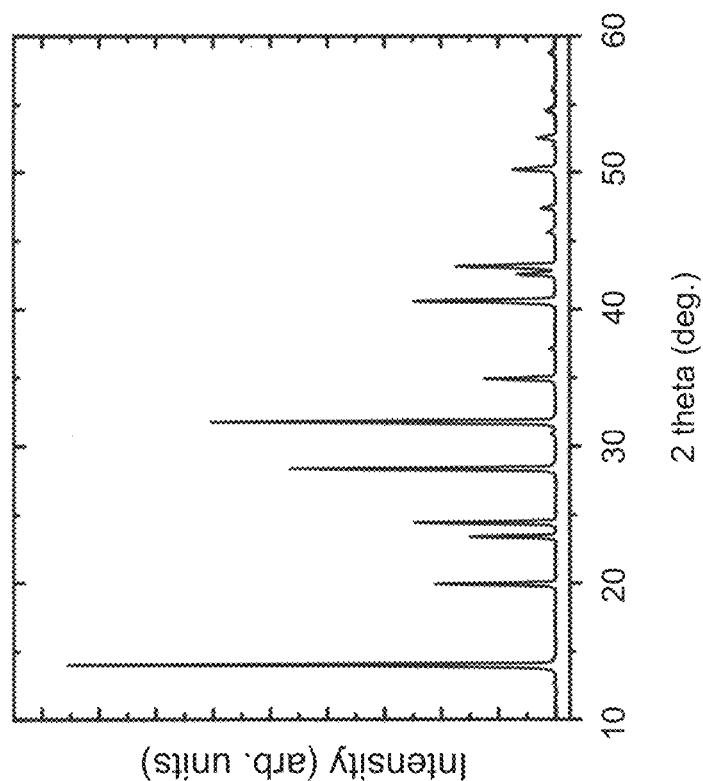
FIG. 11B illustrates a representative XRD pattern of one of a film illustrated in FIG. 11A

It was demonstrated that the introduction of a controlled amount of mobile sodium ions into a diffusion facilitated support medium during the crystallization of perovskite helps to grow continuous films with large, micron-size crystallite domains. Here, we adopt the same additive assisted grain growth strategy to fill up the small voids in the AJ printed film (FIG. 9A, AFR: 20 sccm and SFR: 10-15 sccm) with large grains. A small amount (2 mol %) of sodium iodide is added as an additive in the MAI formulation (in IPA:DMF) and is deposited on nanoporous $PbI_2$ layer by the AJP system. Top-view SEM images of the perovskite films prepared from such a formulation with varied gas flow rates are presented in FIG. 11A. It is seen that high quality, pinhole-free and continuous perovskite films with larger grains (average grain size of ≈1 μm at AFR of 20-22 sccm and SFR of 10 sccm; see FIG. 12) can be obtained when NaI-containing MAI aerosol is deposited on nanoporous $PbI_2$ layers. The larger grain size also indicates improved crystallization of the perovskite film, which is confirmed by the XRD pattern (FIG. 11B). The crystal structure still follows that of the pristine tetragonal perovskite phase. However, compared to the pristine samples made without an additive, the intensity of the characteristic peaks corresponding to the tetragonal I$_4$/mcm structure increases significantly after the NaI addition. This suggests that the crystal grains in the CH$_3$NH$_3$PbI$_3$ perovskite films formed by this new additive assisted method are more oriented. TRPL measurements on these films further reveal longer average carrier lifetime (see FIG. 7 and Table 1 above).

The results shown above demonstrate that it is feasible to fabricate pin-hole-free, highly-uniform, high-purity, and large-grained thin-films of perovskite films with desirable optoelectronic properties using a hands-off automated approach. Nevertheless, successful automated fabrication needs to consider optimized AJP conditions, proper ink formulation, and the right seed layer e.g. compact/nanoporous PbI$_2$.

Figure 11A:
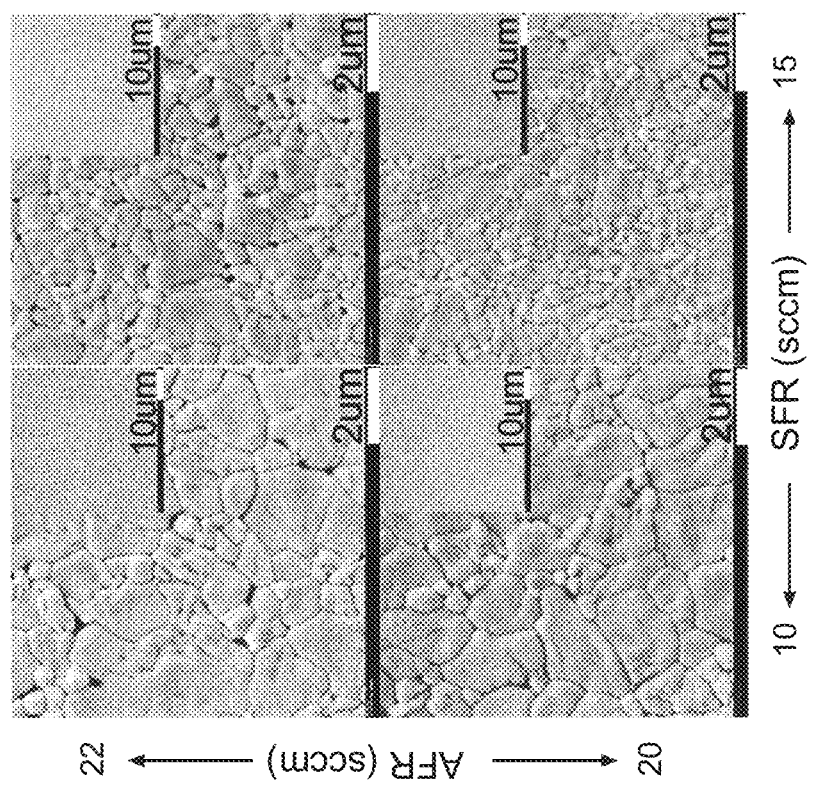
FIG. 11A depicts top view SEM images of the AJ printed perovskite films fabricated from nanoporous $PbI_2$ layer on a glass/ITO/PEDOT:PSS surface with 2 mol % NaI additive in the $CH_3NH_3I$ ink.
Figure 12:
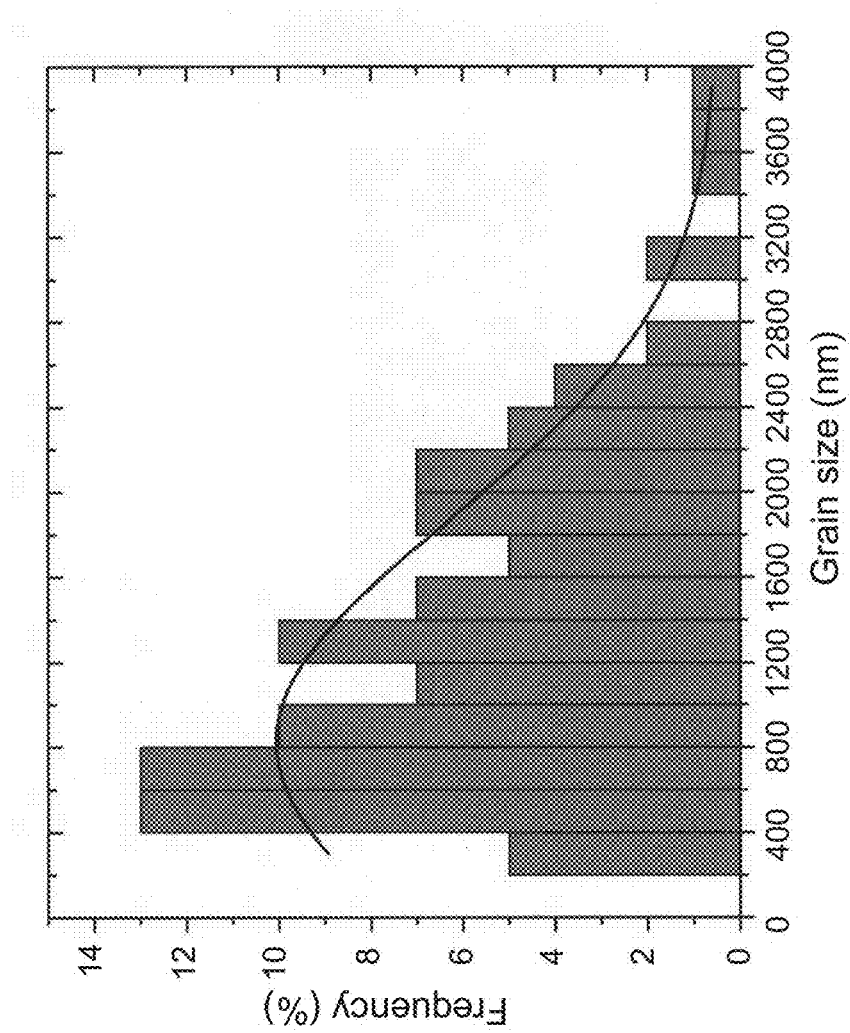
FIG. 12 illustrates grain size distribution of the MAI (mixed with NaI additive) aerosol (AFR: 20-22 sccm and SFR: 10 sccm) deposited film on nanoporous $PbI_2$ layer as measured from the SEM image in FIG. 11A.
Figures 14A, 14B:
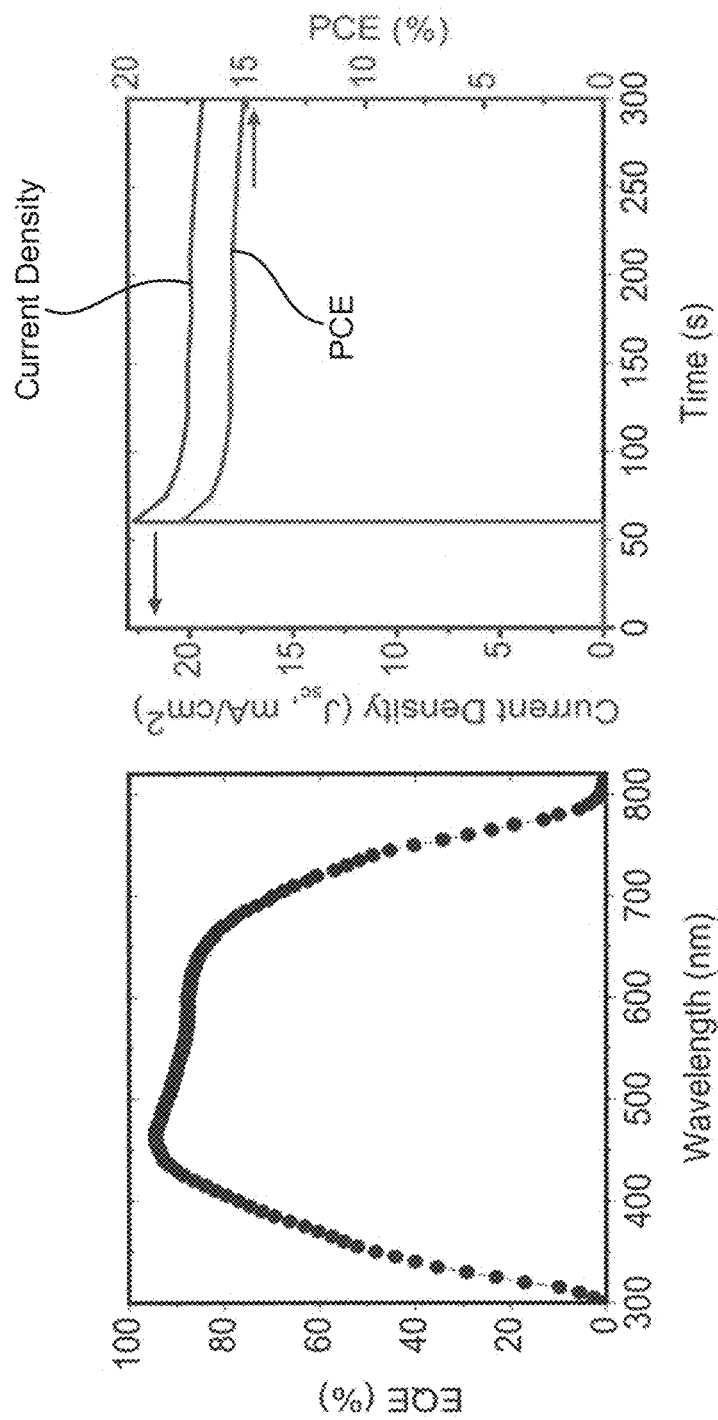
FIG. 14A depicts external quantum efficiency (EQE) spectra of a 15.4% cell made by aerosol jet printing (the integrated $J_{sc}$ from this EQE data is 20 $mA/cm^2$).
FIG. 14B illustrates steady-state photocurrent output and power-conversion-efficiency (% PCE) of the cell of FIG. 14A at its maximum power point (0.78 V).
Figures 16A, 16B:
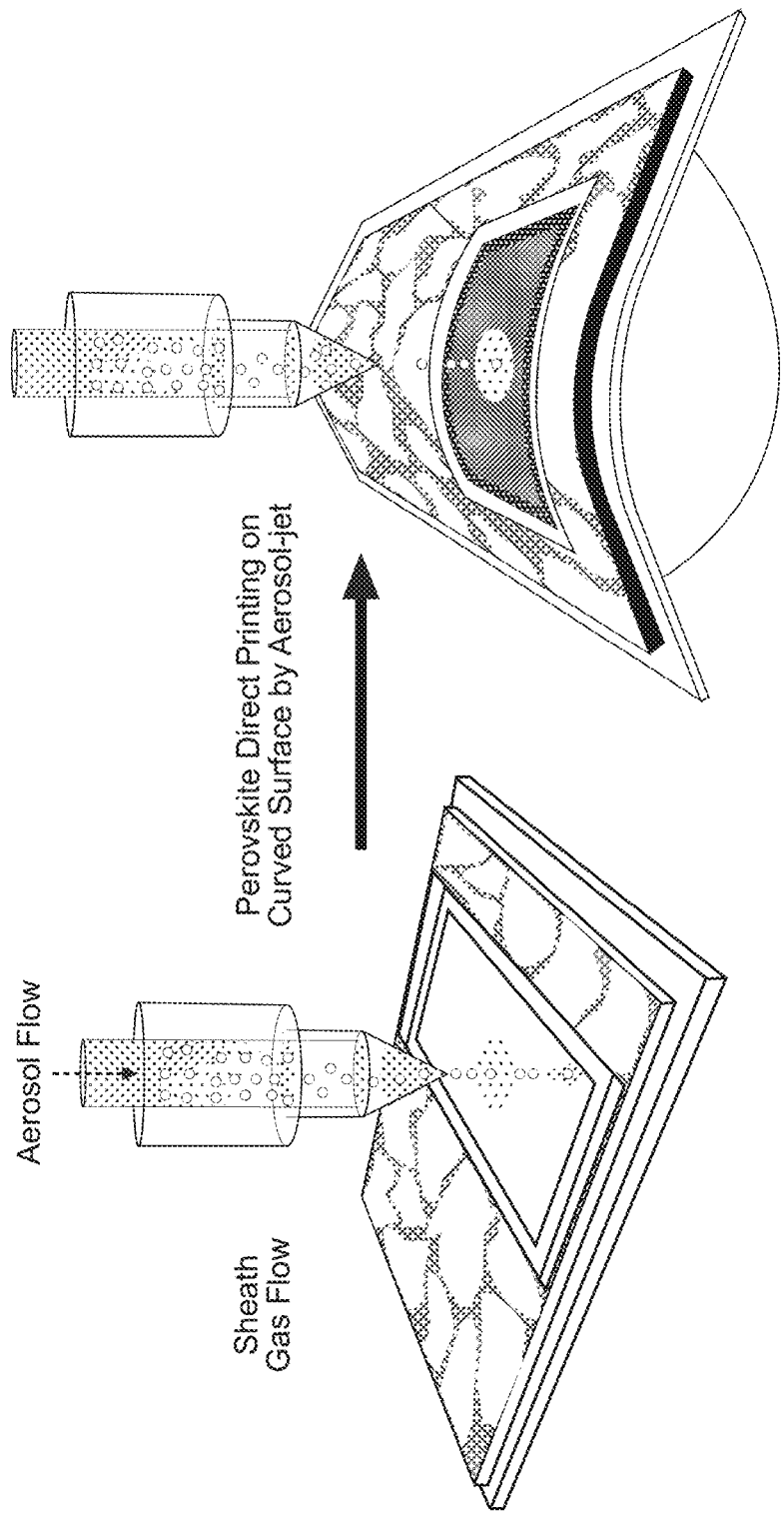
FIGS. 16A-16B depict perovskite direct printing on a curved surface by an aerosol jet.

To quantify the optoelectronic performance of the perovskite layers crystallized at the mist-solid interface with the help of AJP, they may be integrated into a p-i-n type PHJ solar cell device with a glass/ITO/PEDOT:PSS/ CH$_3$NH$_3$PbI$_3$/PC71BM/C60/Al architecture (FIG. 13A) and tested. Since voids in perovskite films have already been shown to cause shorting in thin-film PV devices and diminished performances are obtained, we will focus instead on a comparison of two different pinhole-free perovskite device paradigms toward PHJ device applications; (1) films with small grains prepared from a compact PbI$_2$ layer without NaI additive (representative sample in FIG. 2A, pixel ⑫), and (2) films with large grains prepared from a nanoporous PbI$_2$ layer with NaI additive (representative top-view SEM image of the film in FIG. 11A). The performances of the fabricated solar cell devices are measured by the current-density (*voltage (V) characterization curves under light intensities of 100 mW/cm$^2$. Among all the devices, the highest power conversion efficiency (PCE) is demonstrated by the solar cell resulting from the additive enhanced crystallization of a pinhole-free, large grained perovskite active layer. A champion cell exhibiting an outstanding PCE of 15.4% with an impressive fill factor of 76%, a short-circuit current density (Jsc) of 21 mA/cm$^2$ and an open-circuit voltage (Voc) of 0.96 V, is obtained when NaI is used to induce larger grain sizes and mitigate defects in perovskite films for photovoltaic cells (see FIG. 13B and FIGS. 14A-14B). FIG. 14A illustrates an external quantum efficiency (EQE) spectra of a 15.4% cell made by aerosol jet printing (the integrated Jsc from this EQE data is 20 mA/cm$^2$). FIG. 11 B illustrates steady-state photocurrent output and power-conversion-efficiency (% PCE) of the same cell at its maximum power point (0.78 V).

On the other hand, in case of additive-free fabrication of pinhole-free perovskites, the highest PCE reaches at 11.6% which is considerably lower in performance than the additive based one. Here, all the photovoltaic device parameters, including FF, Jsc and Voc are dramatically reduced resulting in overall decrease in device PCEs. Consistent with the performance characteristics of the best cells, the statistical distribution of the PCE for more than 50 devices each made with and without additive follows a similar trend as shown in FIG. 13C. The hysteresis in all of our fabricated devices is negligible, which is very similar to other comparable PHJ device structures. The improved photovoltaic performance of the perovskite devices made from nanoporous PbI$_2$ layer by the additive enhanced route may be attributed to the full conversion of PbI$_2$ to CH$_3$NH$_3$PbI$_3$ and reduced recombination of photogenerated charge carriers at much smaller grain boundary areas in large crystal-line domains of perovskite. It is notable that the perovskite cells fabricated by AJP exhibit very narrow distribution of device performances compared to those made by fully spin-coating process, indicating that the fabrication steps can be more reproducibly controlled in the AJP system. Taken together, these results unveil the capability of the AJP system for producing perovskite films having excellent morphology and compositional purity via the introduction of an AJP process.

Finally, to unlock another attribute of the AJP system, direct-write printing of the perovskite active layer as an array of curved stripes on a hemispherical surface is demonstrated. Designing non-conventional fabrication methods for solar cell manufacturing directly on the surface of arbitrary three-dimensional objects could enable numerous embedded structural power applications with forms varying from self-powered robotics and zero-fuel ultra-lightweight aerial vehicles to energy-efficient smart buildings to wearable electronics. To date, a transfer process of fully manufactured solar panels has been primarily used to conform to non-planar form factors of three-dimensional objects. A fully automated solar cell production technology based on additive printing of component materials right onto the targeted structures could be advantageous due to its non-subtractive nature, easy adaptability to different form factors, and possible elimination of traditional module installation cost.

As a proof-of-concept demonstration of producing printed thin-film perovskites films on non-planar surfaces, a PbI$_2$ ink was aerosol jet deposited directly onto an ITO/PEDOT:PSS coated PET substrate attached to a hemispherical base surface to form the PbI$_2$ film (see FIGS. 15A-15B). The three axes of motion control (X and Y axes for the substrate and Z for the print head) in the printer permit automated non-planar deposition where a constant working distance can be maintained throughout the deposition process. This is facilitated by the intrinsically collimated aerosol stream where working distances can be varied between 2 mm and 10 mm with negligible loss in feature fidelity.

After depositing the PbI$_2$ layer, MAI can be aerosol jet deposited precisely onto the previous layer using the fiducial alignment routines included in the AJP system (FIG. 15C). Here, the film is ultimately transformed to CH$_3$NH$_3$PbI$_3$ perovskite after mist-solid crystallization process, as discussed above. After non-planar deposition and perovskite transformation, the PET-supported samples are removed from the hemispherical support and are laid flat in order to fabricate complete solar cells in a planar PET/ITO/PEDOT: PSS/Perovskite/PCBM/C60/Al structure. These devices deliver PCEs as high as 5.4% with a Voc of 870 mV, a J$_{sc}$ of 11.7 mA/cm$^2$ and a FF of 53% (see FIG. 15D). Such a notable PCE at the very initial stage of the technology development indicates exciting opportunities for further process optimization and also provides a wider view of pursuing 3D aero-sol-jet printing systems for designing entirely new thin-film device fabrication rules and augmenting solar cell manufacturing as a whole.

In conclusion, we have successfully implemented automation in hybrid perovskite film fabrication and have presented a systematic comprehensive study on mitigating defects of CH$_3$NH$_3$PbI$_3$ film growth via a mist-solid crystallization process. This approach enables reproducible fabrication of high-quality, printed thin-film perovskite with tailored composition, morphology and electronic properties suitable for the 'lab-to-fab' technology transition. Using a relatively small concentration of NaI additive in the precursor ink, highly crystalline, continuous and large grained phase-pure perovskite thin-films are produced by aerosol jet printing under an ambient atmosphere. These results contributed significantly to achieving the outstanding solar cell PCEs up to 15.4% with very narrow performance distribution. The printing process for preparing such perovskite films is scalable and less labor intensive as compared to conventional two-step solution deposition process. Endowed with high-fidelity and process robustness, the applicability of this approach is likely to be extended to the growing family of perovskite semiconductors where the integration of thin-films into sophisticated architectures would lead to the production of a variety of optoelectronic devices such as light-emitting diodes, photodetectors and sensors. Furthermore, the direct-printed 5.4% efficient solar cell on a curved surface marks demonstration of first-of-its-kind in the field of printed photovoltaics. While further improvement of device performance is expected with additional process engineering and judicious materials selection, the ability of AJPs to fabricate printed thin-films directly onto a three-dimensional objects expands the flexibility of substrate selection and opens up new avenues for innovative device design and manufacturing processes.

Methods

Materials and Synthesis—Methylammonium lead tri-iodide perovskite precursors, $PbI_2$ (99.999% purity) were purchased from Sigma-Aldrich and methylammonium iodide ($CH_3NH_3I$, MAI) was synthesized according to the following procedure. In summary, 30 ml of hydroiodic acid (57% in water, Aldrich) was reacted with 27.9 ml of methylamine (40% in methanol) in a 250 ml round-bottom flask at 0° C. for 2 hours with continuous stirring. The resultant white precipitate was recovered by evaporating the solution at 50° C. for 1 hour in a rotary evaporator. The product was dissolved in ethanol, recrystallized using diethyl ether, and dried at 60° C. under vacuum for 24 hours.

PEDOT:PSS was purchased from Heraeus Materials Technology (Dayton, Ohio) and used as received. 1"×1" pre-patterned ITO glass substrates (sheet resistance of 15Ω/□) were purchased from Luminescence Technology Corp. (Taiwan). ITO-coated PET substrates (surface resistivity of 60 ohm/sq.), anhydrous isopropanol, dimethyl sulfoxide, dimethyl formamide, dichlorobenzene, and sodium iodide were obtained from Sigma-Aldrich. 6, 6-phenyl-C71-butyric acid methyl ester ($PC_{71}BM$) and C60 were purchased from American Dye Source, Inc. (Baie D'Urfe, QC). For thermal evaporation, aluminum (99.999% purity) pellets from Kurt J. Lesker Co. (Jefferson Hills, Pa.) were used.

Characterizations and Measurements

J-V characterization of the photovoltaic cells were performed inside an M-Braun Lab-Master glove-box using a Keithley 2410 under a 100 mW $cm^{-2}$ simulated AM 1.5G illumination (Oriel 91160 solar simulator). Before each J-V measurement test, samples were continuously soaked for 10 minutes under the same simulated light. A 2 s delay was applied before each measurement point during the photocurrent characterization (scan rate of 10 mV/s). Incident-photon-conversion-efficiencies (IPCEs) or external quantum efficiencies (EQE) were characterized using an Oriel model QE-PV-SI instrument equipped with a NIST-certified Si diode. Monochromatic light was generated from an Oriel 300 W lamp. A Bruker Dektak XT profilometer (Billerica, Mass.) was used for all thickness measurements and a FEI Sirion scanning electron microscopy (SEM) for all surface morphology investigations. A Rigaku-D/Max-B X-ray diffractometer with Bragg-Brentano parafocusing geometry was used to acquire the XRD patterns. Optical absorption spectra were obtained using an Agilent Cary 5000 spectrometer (Santa Clara, Calif.) in the transmission mode. The time-resolved photoluminescence (TRPL) measurements were done films on glass by an EDINBURGH INSTRUMENT (OB920) with an excitation wavelength of 375 nm from a pulsed laser. Thin metal (Al) and C60 were deposited by using a BOC EDWARDS (Auto 500 system) thermal evaporator integrated to a nitrogen filled glove box where all the post-processing steps of the aerosol jet deposited perovskite films were carried out.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

Alternatives:

The present fabrication method may be applied to any materials in the broad family of organic-inorganic hybrid perovskites having the formula $ABX_3$, or $A_2A'_{y-1}B_yX_{3y+1}$, wherein A and A' are inorganic or organic monovalent cations that are independently selected from $Cs^+$, $Rb^+$, $(HC(NH_2)_2)^+$, $R_1NH_3^+$, $R_1R_2NH_2^+$, $R_1R_2R_3NH^+$, $R_1R_2R_3R_4N^+$, $R_1NH_2^+$, $R_1R_2NH^+$, $R_1R_2R_3N^+$, $R_1R_2N^+$ (any one of $R_1$, $R_2$ and $R_3$ being independently selected from C1-C15 organic substituents comprising from 0 to 15 heteroatoms), or a mixture of any two or more thereof; B is selected from Pb, Sn, Ge, Si or a mixture of any two or more thereof; X is selected from Cl, Br, I or a mixture of any two or more thereof; and y=1, 2 to infinity. Alternative fabrication methods like one-step or multi-step layer-by-layer deposition of precursors may be used instead of the one depicted in the current embodiment. The fabrication steps may be altered by modifying the timing sequence, atomization method (ultrasonic or pneumatic), platen temperature, gas flow rates, or the system hardware. The substrates, interlayers, growth environments, ink formulation, and the method of deposition for each individual layer in the device could possibly be altered too. For example, a full all aerosol jet printed perovskite device is possible using this invention.

What is claimed is:

1. A method for aerosol jet printing a layered perovskite structure, comprising:
   a) applying a PEDOT:PSS layer to a substrate;
   b) applying a layer of lead iodide ($PbI_2$) to the PEDOT:PSS layer; and
   c) applying an aerosol mist of methylammonium iodide ($CH_3NH_3I$) atop the $PbI_2$ layer with an aerosol-jet nozzle to form a $CH_3NH_3PbI_3$ perovskite film layer.

2. The method for aerosol-jet printing a layered perovskite structure of claim 1, wherein the substrate is an ITO glass substrate.

3. The method for aerosol-jet printing a layered perovskite structure of claim 1, wherein the PEDOT:PSS layer is applied by a process selected from spin-coating, inkjet-printing, slot-die-coating, aerosol jet printing, physical vapor deposition, chemical vapor deposition, and electrochemical deposition.

4. The method for aerosol-jet printing a layered perovskite structure of claim 1, wherein the $PbI_2$ layer is applied by a process selected from spin-coating, inkjet-printing, slot-die-coating, aerosol jet printing, physical vapor deposition, chemical vapor deposition, and electrochemical deposition.

5. The method for aerosol-jet printing a layered perovskite structure of claim 4, further comprising
  forming an aerosol mist of $PbI_2$ with an ultrasonic transducer; and
  aerosol-printing the $PbI_2$ aerosol mist with an aerosol jet nozzle.

6. The method for aerosol-jet printing a layered perovskite structure of claim 1, wherein the $PbI_2$ for application to the PEDOT:PSS layer is in a DMF solution, a DMSO solution, a γ-butyrolactone solution, or a combination of thereof.

7. The method for aerosol-jet printing a layered perovskite structure of claim 1, further comprising annealing the $PbI_2$ layer at about 130° C. or lower.

8. The method for aerosol-jet printing a layered perovskite structure of claim 7, wherein the step of annealing the $PbI_2$ layer is performed in the presence of DMF or DMSO vapor.

9. The method for aerosol-jet printing a layered perovskite structure of claim 1, further comprising annealing the $PbI_2$ layer at about 80° C. or lower.

10. The method for aerosol-jet printing a layered perovskite structure of claim 1, further comprising annealing the $CH_3NH_3I$ layer at about 80° C. or lower.

11. The method for aerosol-jet printing a layered perovskite structure of claim 10, wherein the step of annealing the $CH_3NH_3I$ layer is performed in the presence of DMF or DMSO vapor.

12. The method for aerosol-jet printing a layered perovskite structure of claim 1, further comprising annealing the $CH_3NH_3I$ layer at about 130° C. or lower.

13. The method for aerosol-jet printing a layered perovskite structure of claim 1, further comprising applying a layer of $PC_{71}BM$ atop the $CH_3NH_3PbI_3$ perovskite film layer and annealing at room temperature or above in the presence of a residual solvent for 24 hrs or less.

14. The method for aerosol-jet printing a layered perovskite structure of claim 13, wherein the residual solvent comprises chlorobenzene and/or dichlorobenzene.

15. The method for aerosol-jet printing a layered perovskite structure of claim 13, further comprising applying a layer of $C_{60}$ atop the $PC_{71}BM$ film layer.

16. The method for aerosol-jet printing a layered perovskite structure of claim 15, further comprising applying a layer of aluminum (Al) atop the $C_{60}$ layer as a top electrode.

17. The method for aerosol-jet printing a layered perovskite structure of claim 1, further comprising adjusting an atomizer flow rate (AFR) of the aerosol jet nozzle between about 10-25 sccm.

18. The method for aerosol-jet printing a layered perovskite structure of claim 1, further comprising adjusting a sheath flow rate (SFR) of the aerosol jet nozzle between about 5-35 sccm.

19. The method for aerosol-jet printing a layered perovskite structure of claim 1, further comprising forming the aerosol mist of methylammonium iodide ($CH_3NH_3I$) with one of a pneumatic transducer and an ultrasonic transducer.

* * * * *